(12) United States Patent
Kikai et al.

(10) Patent No.: US 10,615,062 B2
(45) Date of Patent: Apr. 7, 2020

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Takaya Kikai, Kumamoto (JP); Yuichi Yoshida, Kumamoto (JP); Yuzo Ohishi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/879,561

(22) Filed: Jan. 25, 2018

(65) Prior Publication Data

US 2018/0218929 A1    Aug. 2, 2018

(30) Foreign Application Priority Data

Jan. 27, 2017   (JP) .................. 2017-013013

(51) Int. Cl.

| H01L 21/67 | (2006.01) |
| H01L 21/687 | (2006.01) |
| B05C 11/08 | (2006.01) |
| H01L 21/677 | (2006.01) |
| H01L 21/02 | (2006.01) |
| B05C 11/10 | (2006.01) |
| H01L 21/311 | (2006.01) |
| H01L 21/027 | (2006.01) |

(52) U.S. Cl.
CPC ........ *H01L 21/67115* (2013.01); *B05C 11/08* (2013.01); *B05C 11/1002* (2013.01); *H01L 21/0231* (2013.01); *H01L 21/0271* (2013.01); *H01L 21/31138* (2013.01); *H01L 21/6715* (2013.01); *H01L 21/67063* (2013.01); *H01L 21/67253* (2013.01); *H01L 21/67739* (2013.01); *H01L 21/68742* (2013.01); *H01L 21/68757* (2013.01)

(58) Field of Classification Search
CPC combination set(s) only.
See application file for complete search history.

(56) References Cited

FOREIGN PATENT DOCUMENTS

JP    2016-027617 A    2/2016

*Primary Examiner* — Ratisha Mehta
(74) *Attorney, Agent, or Firm* — Abelman, Frayne & Schwab

(57) ABSTRACT

Disclosed is a substrate processing apparatus including: a processing chamber that accommodates a substrate; a light source that radiates energy rays for a processing to the substrate in the processing chamber; a rotation driving unit that rotates at least one of the substrate and the light source around an axis intersecting with the substrate in the processing chamber; an opening/closing mechanism that switches between an open state and a closed state; and a controller configured to control the opening/closing mechanism to switch between the open state and the closed state, to increase a light emission amount of the light source in synchronization with the switch of the open state to the closed state by the opening/closing mechanism, and to decrease the light emission amount of the light source in synchronization with the switch of the closed state to the open state by the opening/closing mechanism.

15 Claims, 14 Drawing Sheets

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2017-013013 filed on Jan. 27, 2017 with the Japan Patent Office, the disclosure of which is incorporated herein in its entirety by reference.

TECHNICAL FIELD

The present disclosure relates to a substrate processing apparatus, a substrate processing method, and a storage medium.

BACKGROUND

Japanese Patent Laid-Open Publication No. 2016-027617 discloses a substrate processing method in which a substrate on which a film to be processed is formed is disposed in a processing chamber of an oxygen-containing atmosphere having a gas flow rate of 10 cm/sec or less, and the substrate is irradiated with ultraviolet rays to remove a part of the film to be processed from the substrate.

SUMMARY

According to an aspect of the present disclosure, there is provided a substrate processing apparatus including: a processing chamber configured to accommodate a substrate; a light source configured to radiate energy rays for a processing to the substrate in the processing chamber; a rotation driving unit configured to rotate at least one of the substrate and the light source around an axis intersecting with the substrate in the processing chamber; an opening/closing mechanism configured to switch between an open state where an air flow is allowed to pass from an outside of the processing chamber to an inside of the processing chamber and from the inside of the processing chamber to the outside of the processing chamber and a closed state where the air flow is interrupted; and a controller configured to control the opening/closing mechanism to switch between the open state and the closed state, to increase a light emission amount of the light source in synchronization with the switch of the open state to the closed state by the opening/closing mechanism, and to decrease the light emission amount of the light source in synchronization with the switch of the closed state to the open state by the opening/closing mechanism.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
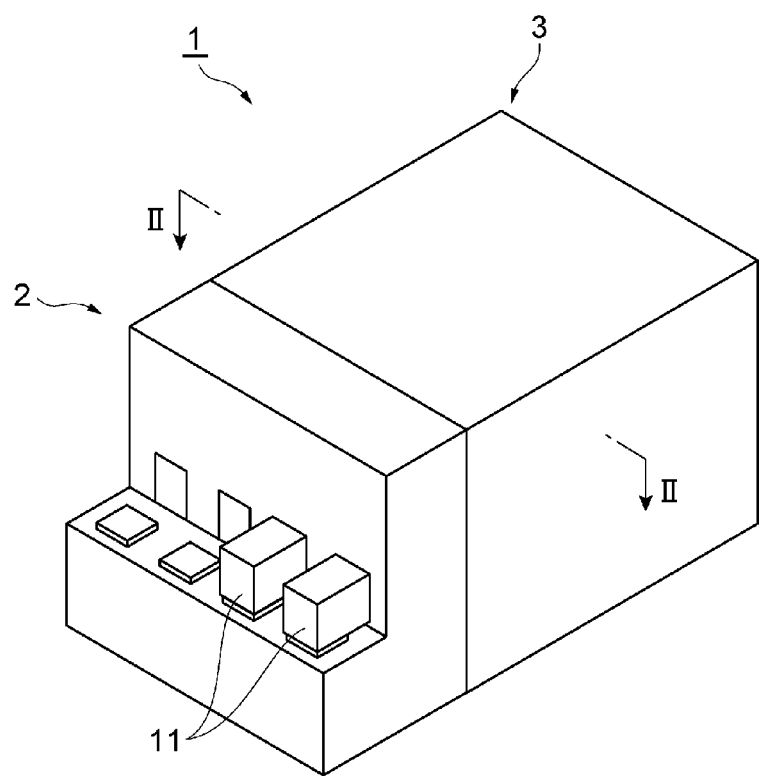
FIG. 1 is a perspective view schematically illustrating a configuration of a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to the above-described substrate processing method, the processing unevenness caused by an air flow in the processing chamber (unevenness in the degree of progress of the processing due to the irradiation with ultraviolet rays) is reduced. Thus, it is possible to enhance the uniformity of the degree of progress of the processing by irradiation with ultraviolet rays (energy rays). The present disclosure is to provide a substrate processing apparatus and a substrate processing method capable of further enhancing the uniformity of the degree of progress of the processing by irradiation with energy rays.

According to an aspect of the present disclosure, there is provided a substrate processing apparatus including: a processing chamber configured to accommodate a substrate; a light source configured to radiate energy rays for a processing to the substrate in the processing chamber; a rotation driving unit configured to rotate at least one of the substrate and the light source around an axis intersecting with the substrate in the processing chamber; an opening/closing mechanism configured to switch between an open state where an air flow is allowed to pass from an outside of the processing chamber to an inside of the processing chamber and from the inside of the processing chamber to the outside of the processing chamber and a closed state where the air flow is interrupted; and a controller configured to control the opening/closing mechanism to switch between the open state and the closed state, to increase a light emission amount of the light source in synchronization with the switch of the open state to the closed state by the opening/closing mechanism, and to decrease the light emission amount of the light source in synchronization with the switch of the closed state to the open state by the opening/closing mechanism.

According to the substrate processing apparatus, since at least one of the substrate in the processing chamber and the light source is rotated by the rotation driving unit, unevenness of the intensity of the energy rays reaching each part of the substrate from the light source (hereinafter, referred to as an "illuminance spot") is reduced. Here, it is expected that the processing unevenness caused by the air flow (processing unevenness caused by the air flow in the processing chamber) is also reduced by the rotation of at least one of the substrate and the light source. However, the present inventors have found that even when at least one of the substrate and the light source is rotated, the processing unevenness caused by an air flow for ventilation in the processing chamber may not be sufficiently reduced in some cases. Therefore, the substrate processing apparatus further includes an opening/closing mechanism and a controller, and the controller is configured to control the opening/closing mechanism to switch between the open state and the closed state, to increase a light emission amount of the light source in synchronization with the switch of the open state to the closed state by the opening/closing mechanism, and to decrease the light emission amount of the light source in synchronization with the switch of the closed state to the open state by the opening/closing mechanism. As a result, it is possible to reduce the processing unevenness caused by the air flow which is not reduced by the rotation of the substrate. Therefore, it is possible to further enhance the uniformity of the degree of progress of the processing by irradiation with energy rays.

The substrate processing apparatus may further include a hot plate configured to heat the substrate in the processing chamber. The rotation driving unit may be configured to rotate the substrate and the hot plate together. The controller may be further configured to control the rotation driving unit to increase a rotation speed of the substrate and the hot plate in synchronization with an increase in the light emission amount of the light source and to control the rotation driving unit to decrease the rotation speed of the substrate and the hot plate in synchronization with a decrease in the light emission amount of the light source.

In this case, since the rotation speed of the substrate and the hot plate is decreased at the time of the decrease in the light emission amount of the light source, it is possible to reduce the total rotation angle of the substrate and the hot plate. As a result, it is possible to simplify the configuration for continuing the energy supply to the hot plate during the rotation.

The controller may be further configured: when increasing the rotation speed of the substrate and the hot plate in synchronization with the increase in the light emission amount of the light source, to control the rotation driving unit to increase the rotation speed of the substrate and the hot plate before the increase in the light emission amount of the light source; when decreasing the rotation speed of the substrate and the hot plate in synchronization with the decrease in the light emission amount of the light source, to control the rotation driving unit to decrease the rotation speed of the substrate and the hot plate after the decrease in the light emission amount of the light source; and before the rotation speed of the substrate and the hot plate increases after the rotation speed of the substrate and the hot plate decreases, to control the rotation driving unit to reversely rotate the substrate and the hot plate until the substrate returns to a position before the light emission amount of the light source is decreased.

In this case, since the rotation speed of the substrate and the hot plate before the increase in the light emission amount of the light source and the rotation speed of the substrate and the hot plate is decreased after the decrease in the light emission amount of the light source, the progress of the processing is reduced during the acceleration/deceleration in which the rotation speed of the substrate is not stabilized. Before the rotation speed of the substrate and the hot plate increases after the rotation speed of the substrate and the hot plate decreases, since the substrate and the hot plate are reversely rotated until the substrate returns to a position before the light emission amount of the light source is decreased, the difference between the position of the substrate at the time of the decrease in the light emission amount of the light source and the position of the substrate at the time of the increase in the light emission amount of the light source is reduced. Therefore, since an illuminance spot caused by the acceleration/deceleration of the rotation of the substrate is reduced, it is possible to further enhance the uniformity of the degree of progress of the processing by irradiation with energy rays.

The controller may be configured to: when decreasing the rotation speed of the substrate and the hot plate in synchronization with the decrease in the light emission amount of the light source, to control the rotation driving unit to start decreasing the rotation speed of the substrate and the hot plate at the time of or after the decrease in the light emission amount of the light source; and when increasing the rotation speed of the substrate and the hot plate in synchronization with the increase in the light emission amount of the light source, to control the rotation driving unit to increase the rotation speed of the substrate and the hot plate under conditions that the increase in the rotation speed of the substrate and the hot plate is completed at the time of or before the increase in the light emission amount of the light source and that a position of the substrate at the time of the increase in the light emission amount of the light source and a position of the substrate at the time of the decrease in the light emission amount of the light source coincide with each other.

In this case, the progress of the processing is further reduced during the increase and decrease of the rotation speed, and the difference between the position of the substrate at the time of the decrease in the light emission amount of the light source and the position of the substrate at the time of the increase in the light emission amount of the light source is further reduced. Therefore, since an illuminance spot caused by the increase and decrease in the rotation speed of the substrate is further reduced, it is possible to further enhance the uniformity of the degree of progress of the processing by irradiation with energy rays.

The controller may be configured: to perform a first rotation control of controlling the rotation driving unit to rotate the substrate and the hot plate together in a first direction, decrease the rotation speed of the substrate and the hot plate in the first direction in synchronization with the decrease in the light emission amount of the light source, and increase the rotation speed of the substrate and the hot plate in the first direction in synchronization with the increase in the light emission amount of the light source; and to perform a second rotation control of controlling the rotation driving unit to rotate the substrate and the hot plate together in a second direction opposite to the first direction, decrease the rotation speed of the substrate and the hot plate in the second direction in synchronization with the decrease in the light emission amount of the light source, and increase the rotation speed of the substrate and the hot plate in the second direction in synchronization with the increase in the light emission amount of the light source. The controller may be configured to perform the first rotation control and the second rotation control under a condition where a position of the substrate at the time when the decrease in the rotation speed is completed in the first rotation control (hereinafter, referred to as a "first position") and a position of the substrate at the time when the decrease in the rotation speed is completed in the second rotation control (hereinafter, referred to as a "second position") are different from each other.

In this case, since an illuminance spot caused by the increase and decrease in the rotation speed of the substrate is reduced by setting the first position and the second position to be displaced from each other, it is possible to further enhance the uniformity of the degree of progress of the processing by irradiation with energy rays.

The controller may be configured to perform the first rotation control and the second rotation control such that a rotation range of the substrate during the increase and decrease in the rotation speed in the first rotation control (hereinafter, referred to as a "first rotation range") and a rotation range of the substrate during the increase and decrease in the rotation speed in the second rotation control (hereinafter, referred to as a "second rotation range") do not overlap with each other.

In this case, since an illuminance spot caused by the increase and decrease in the rotation speed of the substrate is further reduced by setting the first rotation range and the second rotation range not to overlap with each other, it is possible to further enhance the uniformity of the degree of progress of the processing by irradiation with energy rays.

The controller may be configured to perform the first rotation control to repeat the increase and the decrease in the rotation speed of the substrate and the hot plate in the first direction in a constant cycle, and to perform the second rotation control to repeat the increase and the decrease in the rotation speed of the substrate and the hot plate in the second direction in the constant cycle.

In this case, it is possible to repeat the increase and the decrease in the rotation speed of the substrate and the hot plate in the first direction in a constant cycle and to switch between the closed state and the open state by the opening/closing mechanism in a constant cycle, so that processing unevenness caused by the variation of the ventilation cycle is reduced. Therefore, it is possible to further enhance the uniformity of the degree of progress of the processing by irradiation with energy rays.

According to another aspect of the present disclosure, there is provided a substrate processing method including: accommodating a substrate in a processing chamber; radiating energy rays for a processing to the substrate in the processing chamber; rotating at least one of the substrate and the light source around an axis intersecting with the substrate in the processing chamber; switching between an open state where an air flow is allowed to pass from an outside of the processing chamber to an inside of the processing chamber and from the inside of the processing chamber to the outside of the processing chamber and a closed state where the air flow is interrupted; increasing a light emission amount of the light source in synchronization with the switch of the open state to the closed state by the opening/closing mechanism; and decreasing the light emission amount of the light source in synchronization with the switch of the closed state to the open state by the opening/closing mechanism.

The substrate processing method may further include: heating the substrate in the processing chamber; rotating the substrate and the hot plate together; increasing a rotation speed of the substrate and the hot plate in synchronization with an increase in the light emission amount of the light source; and decreasing the rotation speed of the substrate and the hot plate in synchronization with a decrease in the light emission amount of the light source.

The substrate processing method may further include: when increasing the rotation speed of the substrate and the hot plate in synchronization with the increase in the light emission amount of the light source, increasing the rotation speed of the substrate and the hot plate before the increase in the light emission amount of the light source; when decreasing the rotation speed of the substrate and the hot plate in synchronization with the decrease in the light emission amount of the light source, decreasing the rotation speed of the substrate and the hot plate after the decrease in the light emission amount of the light source; and before the rotation speed of the substrate and the hot plate increases after the rotation speed of the substrate and the hot plate decreases, reversely rotating the substrate and the hot plate until the substrate returns to a position before the light emission amount of the light source is decreased.

When decreasing the rotation speed of the substrate and the hot plate in synchronization with the decrease in the light emission amount of the light source, the decrease in the rotation speed of the substrate and the hot plate may be started at the time of or after the decrease in the light emission amount of the light source, and when increasing the rotation speed of the substrate and the hot plate in synchronization with the increase in the light emission amount of the light source, the rotation speed of the substrate and the hot plate may be increased under conditions that the increase in the rotation speed of the substrate and the hot plate is completed at the time of or before the increase in the light emission amount of the light source and that a position of the substrate at the time of the increase in the light emission amount of the light source and a position of the substrate at the time of the decrease in the light emission amount of the light source coincide with each other.

The substrate processing method may further includes: performing a first rotation control of rotating the substrate and the hot plate together in a first direction, decreasing the rotation speed of the substrate and the hot plate in the first direction in synchronization with the decrease in the light emission amount of the light source, and increasing the rotation speed of the substrate and the hot plate in the first direction in synchronization with the increase in the light emission amount of the light source; and performing a second rotation control of rotating the substrate and the hot plate together in a second direction opposite to the first direction, decreasing the rotation speed of the substrate and the hot plate in the second direction in synchronization with the decrease in the light emission amount of the light source, and increasing the rotation speed of the substrate and the hot plate in the second direction in synchronization with the increase in the light emission amount of the light source. The first rotation control and the second rotation control may be performed under a condition where a position of the substrate at the time when the decrease in the rotation speed is completed in the first rotation control and a position of the substrate at the time when the decrease in the rotation speed is completed in the second rotation control are different from each other.

The first rotation control and the second rotation control may be performed such that a rotation range of the substrate during the increase and decrease in the rotation speed in the first rotation control and a rotation range of the substrate during the increase and decrease in the rotation speed in the second rotation control do not overlap each other.

The first rotation control may be performed to repeat the increase and the decrease in the rotation speed of the substrate and the hot plate in the first direction in a constant cycle, and the second rotation control may be performed to repeat the increase and the decrease in the rotation speed of the substrate and the hot plate in the second direction in the constant cycle.

According to still another aspect of the present disclosure, there is provided a non-transitory computer-readable storage medium that stores a program that, when executed, cause a computer to execute the substrate processing method described above.

According to the present disclosure, it is possible to further enhance the uniformity of the degree of progress of the processing by irradiation with energy rays.

Hereinafter, exemplary embodiments will be described in detail with reference to the drawings. In the descriptions, the same elements or elements having the same function are denoted by the same reference numerals, and redundant descriptions thereof will be omitted.

[Substrate Processing Apparatus]

A substrate processing apparatus 1 according to the present exemplary embodiment is an apparatus for forming a protective film on a substrate and smoothing the surface of the protective film by etching. The processing target substrate is, for example, a semiconductor wafer W. The protective film is, for example, a so-called hard mask such as spin-on-carbon (SOC).

Figure 2:
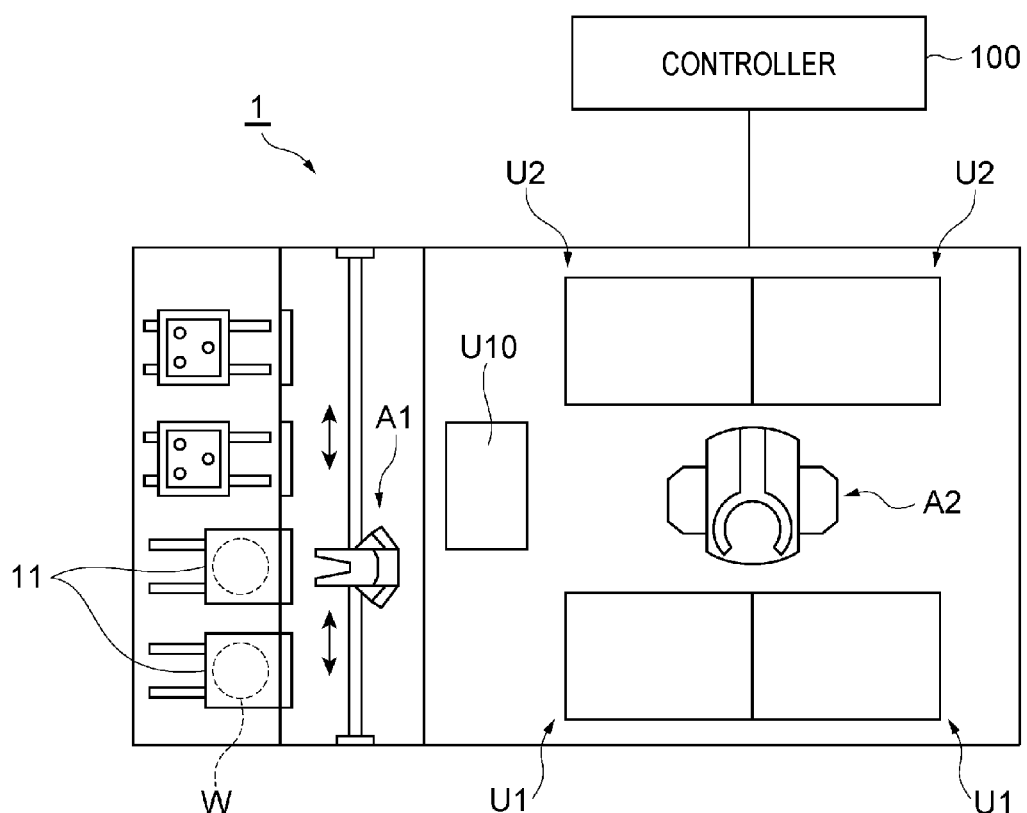
FIG. 2 is a cross-sectional view taken along line II-II of FIG. 1.

As illustrated in FIGS. 1 and 2, the substrate processing apparatus 1 includes a carrier block 2 and a processing block 3 which are adjacent to each other, and includes a controller 100.

The carrier block 2 introduces wafer W into the substrate processing apparatus 1 and leads out the wafer W from the substrate processing apparatus 1. For example, the carrier block 2 is capable of supporting a plurality of carriers 11 for the wafer W, and incorporates a delivery arm A1. Each carrier 11 accommodates, for example, a plurality of circular wafers W. The delivery arm A1 takes out the wafer W from the carrier 11 to deliver the wafer W to the processing block 3, and receives the wafer W from the processing block 3 to return the wafer W to the inside of the carrier 11.

The processing block 3 includes a plurality of liquid processing units U1, a plurality of etching units U2, and a delivery arm A2 that delivers the wafer W to these units. Each liquid processing unit U1 performs a processing of supplying a processing liquid for hard mask formation to the surface of the wafer W to form a coating film (hereinafter, referred to as a "coating processing"). Each etching unit U2 performs a thermal processing for converting the coating into a hard mask and a processing for smoothing the surface of the hard mask by etching (hereinafter, referred to as an "etching processing"). A shelf unit U10 is provided on the carrier block 2 side in the processing block 3. The shelf unit U10 is partitioned into a plurality of cells aligned in the vertical direction.

The controller 100 controls the carrier block 2 and the processing block 3 to perform a coating processing, a thermal processing, and an etching processing on the wafer W. For example, the controller 100 first controls the delivery arm A1 to deliver the wafer W in the carrier 11 to the shelf unit U10. Next, the controller 100 controls the delivery arm A2 to deliver the wafer W in the shelf unit U10 to the liquid processing unit U1, and controls the liquid processing unit U1 to perform the coating processing on the wafer W. Next, the controller 100 controls the delivery arm A2 to deliver the wafer W from the liquid processing unit U1 to the etching unit U2, and controls the etching unit U2 to perform the thermal processing and the etching processing on the wafer W. Next, the controller 100 controls the delivery arm A2 to deliver the wafer W from the etching unit U2 to the shelf unit U10, and controls the delivery arm A1 to return the wafer W from the shelf unit U10 into the carrier 11. Thus, the coating processing, the thermal processing, and the etching process for one wafer W are completed.

[Etching Unit]

Figure 3:
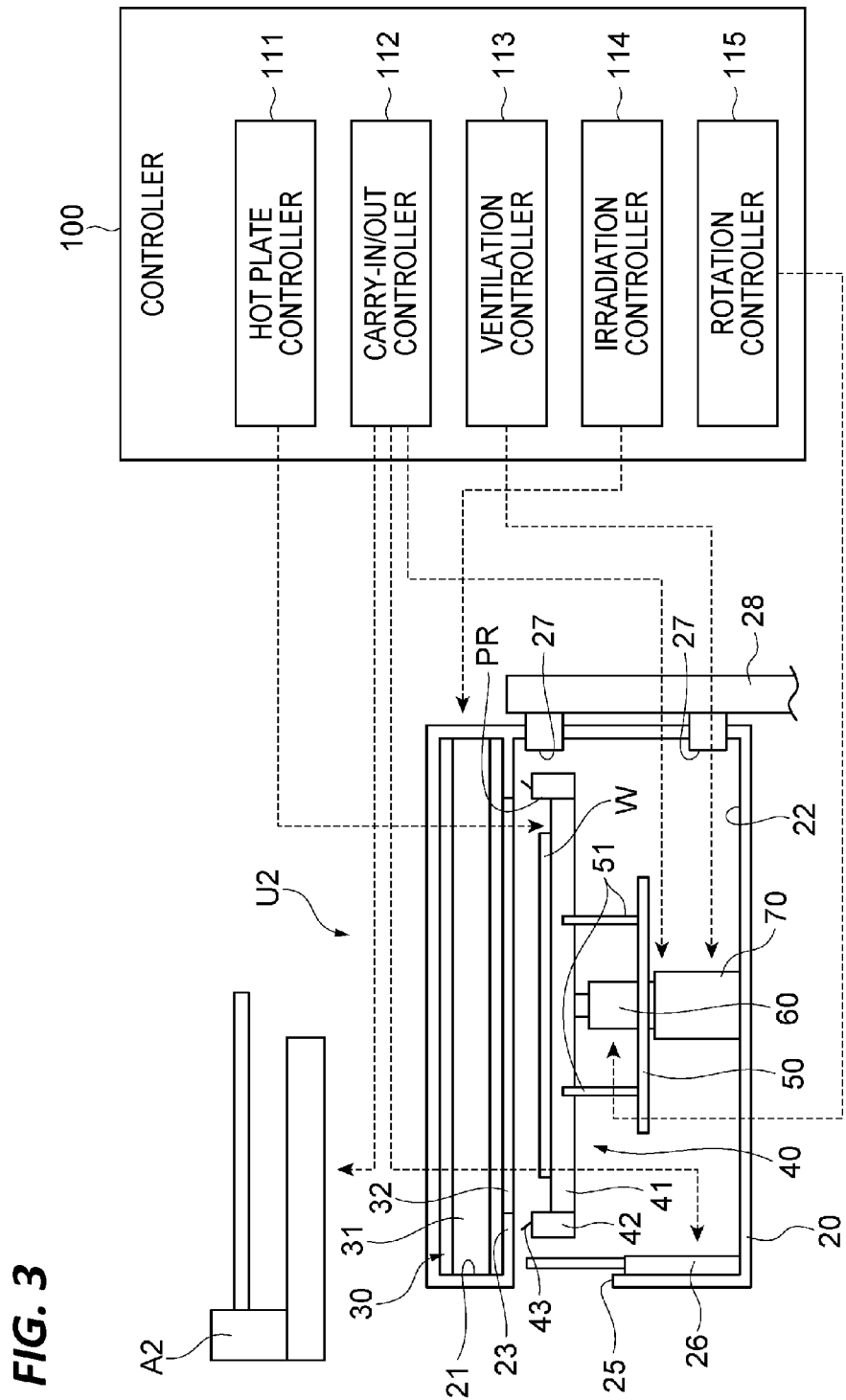
FIG. 3 is a cross-sectional view schematically illustrating a configuration of an etching unit.

Subsequently, the etching unit U2 will be described in detail. As illustrated in FIG. 3, the etching unit U2 includes a processing chamber PR that accommodates the wafer W, a hot plate 41 that heats the wafer W in the processing chamber PR, a light source 31 that radiates energy rays for a processing to the wafer W in the processing chamber PR, a rotation driving unit 60 that rotates the wafer W or the light source 31 around an axis intersecting with (e.g., orthogonal to) the wafer W in the processing chamber PR, and an opening/closing mechanism 70 that switches between an open state where an air flow is allowed to pass from an outside of the processing chamber PR to the inside of the processing chamber PR and from the inside of the processing chamber PR to the outside of the processing chamber PR and a closed state where the air flow is interrupted.

For example, the etching unit U2 includes a case 20, an irradiation unit 30, a first support unit 40, a second support unit 50, a rotation driving unit 60, and an opening/closing mechanism 70.

The case 20 accommodates respective components of the etching unit U2. The case 20 includes a partition wall 23, a window portion 24, an entrance 25, a shutter 26, and an exhaust port 27. The partition wall 23 partitions the inside of the case 20 into an upper first space 21 and a lower second space 22. The first space 21 accommodates a light source 31 which will be described later, and the second space 22 accommodates the first support unit 40, the second support unit 50, the rotation driving unit 60, and the opening/closing mechanism 70 which will be described later.

The entrance 25 is provided on the side wall of the second space 22 and is used for carrying the wafer W into the second space 22 and carrying out the wafer W from the second space 22. The shutter 26 switches the state of the entrance 25 to an open state or a closed state, for example, using an electric motor or an air cylinder as a power source. The open state is a state where the carry-in/out of the wafer W through the entrance 25 is enabled, and the closed state is a state where the carry-in/out of the wafer W through the entrance 25 is disabled. Even in the closed state, the shutter 26 enables ventilation through the entrance 25. That is, the shutter 26 closes the entrance 25 while leaving an opening for ventilation.

The exhaust port 27 is provided on the side wall of the second space 22 on the side opposite to the entrance 25. The exhaust port 27 is connected to an exhaust duct 28 and guides exhaust from the inside of the second space 22 to the outside of the second space 22. Therefore, in the second space 22, an air flow is formed from the entrance 25 side to the exhaust port 27 side. As described above, the shutter 26 closes the entrance 25 while leaving a gap for ventilation. Therefore, the air flow is formed even when the shutter 26 closes the entrance 25.

The first support unit 40 is provided in the second space 22. The first support unit 40 includes a hot plate 41, a side wall 42, and a packing 43. The hot plate 41 has a horizontal upper surface and generates heat using, for example, a heater such as a heating wire as a heat source. The side wall 42 is provided so as to surround the upper surface of the hot plate 41, and defines the processing chamber PR on the hot plate 41. The processing chamber PR accommodates a wafer W. The hot plate 41 horizontally supports the wafer W in the processing chamber PR, and heats the wafer W. The packing 43 is provided along the upper end surface of the side wall 42 to seal the space between the side wall 42 and the partition wall 23.

The second support unit 50 is provided below the first support portion 40 in the second space 22. The second support unit 50 includes a plurality of support pins 51 protruding upward and passing through the hot plate 41.

The rotation driving unit 60 rotates the wafer W in the processing chamber PR and the hot plate 41 together around the axis intersecting with the wafer W. For example, the rotation driving unit 60 rotates the first support unit 40 around a vertical axis using, for example, an electric motor as a power source.

The opening/closing mechanism 70 switches the state of the processing chamber PR to an open state or a closed state. The open state is a state where the air flow is allowed to pass from the outside of the processing chamber PR into the processing chamber PR and from the processing chamber PR to the outside of the processing chamber PR, and the closed state is a state where the air flow is interrupted. For example, the opening/closing mechanism 70 moves up and down the first support unit 40 using, for example, an electric motor or an air cylinder as a power source. When the opening/closing mechanism 70 moves up the first support unit 40, the upper end surface of the side wall 42 approaches the partition wall 23, and the packing 43 is brought into tight contact with the partition wall 23. Therefore, the open state is switched to the closed state. When the opening/closing mechanism 70 moves down the first support unit 40, the packing 43 is separated from the partition wall 23, and the upper end surface of the side wall 42 moves away from the partition wall 23. Therefore, the closed state is switched to the open state.

In the closed state, at least a part of the air flow in the open state (the air flow passing from the outside of the processing chamber PR to the inside of the processing chamber PR and from the inside of the processing chamber PR to the outside of the processing chamber PR) may be interrupted, but all of the air flow in the open state may not necessarily be interrupted. For example, the first support unit 40 may not include the packing 43, and in the closed state, a gap may be formed between the upper end surface of the side wall 42 and the partition wall 23.

Figure 4:
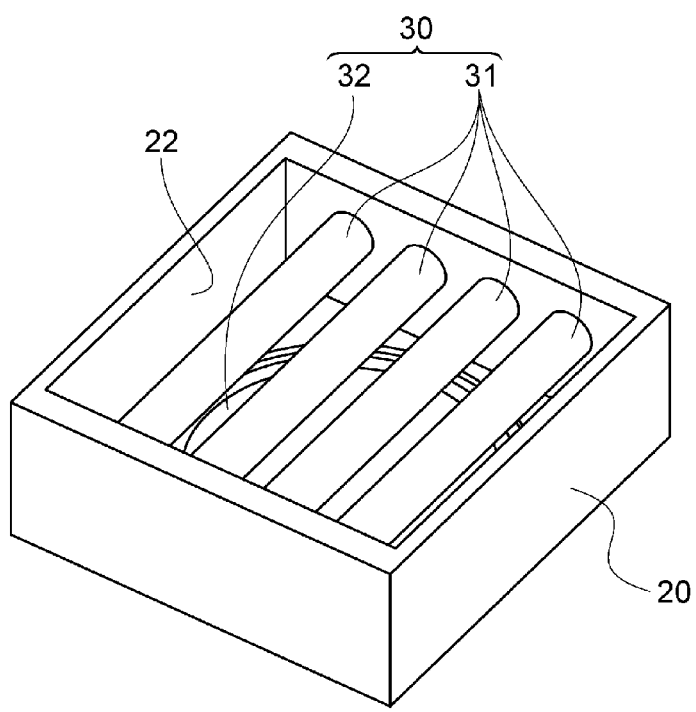
FIG. 4 is a perspective view illustrating an irradiation unit.

The irradiation unit 30 includes a light source 31 and a window portion 32. The light source 31 radiates energy rays for a processing to the wafer W in the processing chamber PR. The energy rays are, for example, ultraviolet rays having a wavelength of 10 to 300 nm. The light source 31 is arranged such that an illuminance spot is generated at least in the circumferential direction on a front surface Wa of the wafer W. For example, the irradiation unit 30 includes at least one straight-tube type light source 31 along a surface facing the wafer W in the processing chamber PR. The irradiation unit 30 may include a plurality of light sources 31 arranged in parallel with each other (see FIG. 4). The window portion 32 is provided in the partition wall 23 at a position corresponding to the processing chamber PR, and transmits the energy rays from the light source 31 to the processing chamber PR side.

The etching unit U2 thus configured is controlled by the above-described controller 100. The controller 100 is configured to control the opening/closing mechanism 70 to switch between the open state and the closed state, to increase a light emission amount of the light source 31 in synchronization with the switch of the open state to the closed state by the opening/closing mechanism 70, and to decrease the light emission amount of the light source 31 in synchronization with the switch of the closed state to the open state by the opening/closing mechanism 70.

The term "synchronization" means that two timings are related, and does not necessarily mean that two timings happen simultaneously. This also applies to the following. For example, even in a case where the two timings are different from each other, the two timings are synchronized when they are repeated in the same order and with the same time difference. Increasing the light emission amount includes turning on the light source 31 in a turn-off state, and decreasing the light emission amount includes turning off the light source 31 in a turn-on state.

The controller 100 may be further configured to control the rotation driving unit 60 to increase a rotation speed of the wafer W and the hot plate 41 in synchronization with an increase in the light emission amount of the light source 31 and to control the rotation driving unit 60 to decrease the rotation speed of the wafer W and the hot plate 41 in synchronization with a decrease in the light emission amount of the light source 31.

Increasing the rotation speed of the wafer W and the hot plate 41 includes starting the rotation of the wafer W and the hot plate 41 which are stopped, and decreasing the rotation speed of the wafer W and the hot plate 41 includes stopping the rotation of the wafer W and the hot plate 41.

For example, the controller 100 includes a hot plate controller 111, a carry-in/out controller 112, a ventilation controller 113, an irradiation controller 114, and a rotation controller as a functional configuration (hereinafter referred to as "function blocks").

The hot plate controller 111 controls the hot plate 41 to adjust the temperature for heating the wafer W. The carry-in/out controller 112 controls the shutter 26, the opening/closing mechanism 70, and the delivery arm A2 to perform the carry-in/out of the wafer W into/from the second space 22. The ventilation controller 113 controls the opening/closing mechanism 70 to switch the processing chamber PR to the open state or the closed state. The irradiation controller 114 controls the irradiation unit 30 to turn on or off the light source 31. The rotation controller 115 controls the rotation driving unit 60 to cause the rotation speed and the rotation angle of the wafer W and the hot plate 41 to follow the target values.

Figure 5:
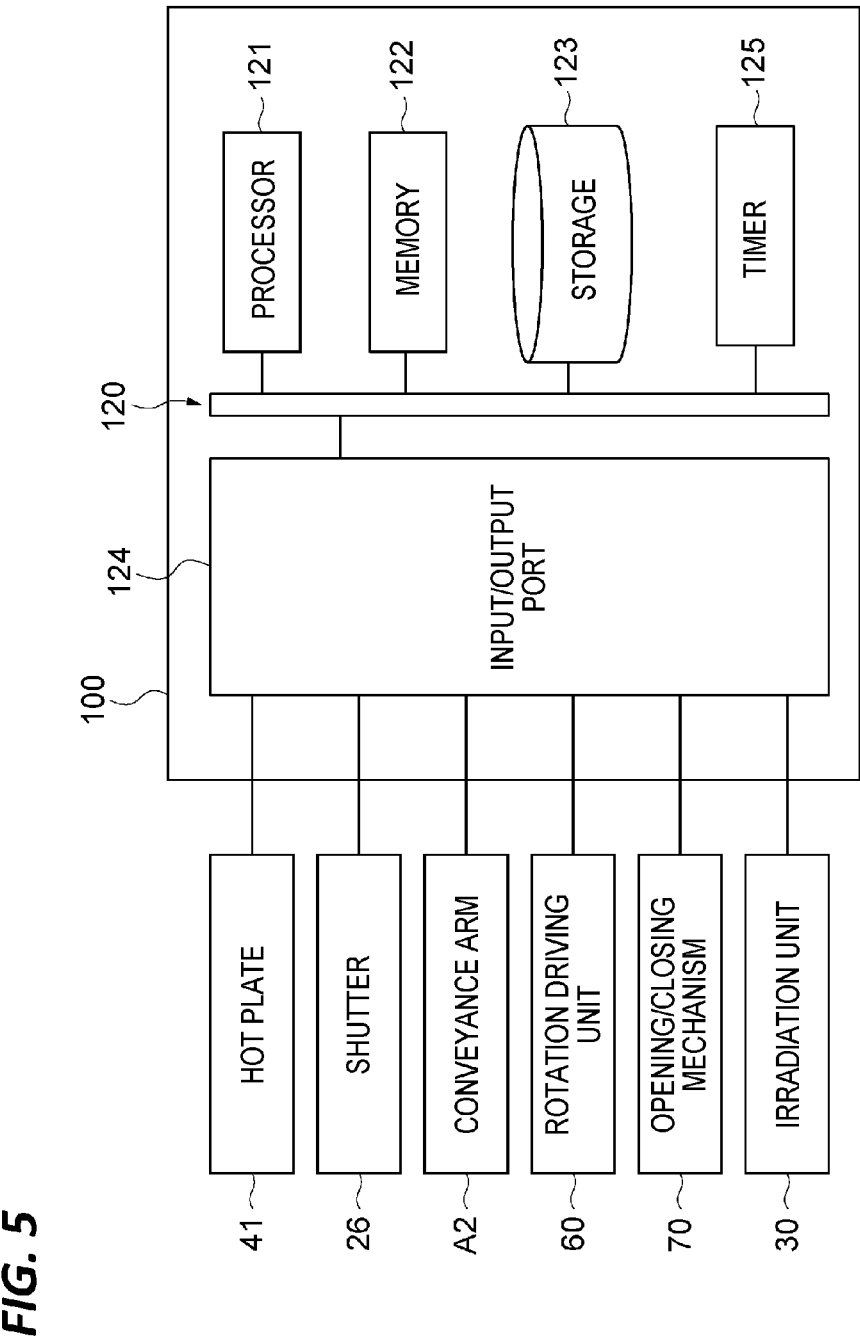
FIG. 5 is a block diagram illustrating a hardware configuration of a controller.

The controller 100 is constituted by one or more control computers. For example, the controller 100 includes a circuit 120 illustrated in FIG. 5. The circuit 120 includes one or a plurality of processors 121, a memory 122, a storage 123, an input/output port 124, and a timer 125.

The storage 123 is a storage medium that stores a program for causing the etching unit U2 to execute a substrate processing method (to be described later). For example, the storage 123 records a program for configuring each of the functional blocks. The storage 123 may be anything as long as it is readable by a computer. Specific examples include a hard disk, a nonvolatile semiconductor memory, a magnetic disk, and an optical disk. The memory 122 temporarily stores, for example, the program loaded from the storage 123 and calculation results of the processor 121. The processor 121 cooperates with the memory 122 to execute the program, thereby constituting each functional block.

In response to a command from the processor 121, the input/output port 124 inputs and outputs an electric signal between the shutter 26, the rotation driving unit 60, the opening/closing mechanism 70, and the irradiation unit 30. The timer 125 measures elapsed time by counting, for example, reference pulses in a constant period.

The hardware configuration of the controller 100 is not necessarily limited to those constituting each function block by a program. For example, at least a part of the functional blocks of the controller 100 may be constituted by a dedicated logic circuit or an application specific integrated circuit (ASIC) in which the dedicated logic circuit is integrated.

[Substrate Processing Method]

Figure 7A:
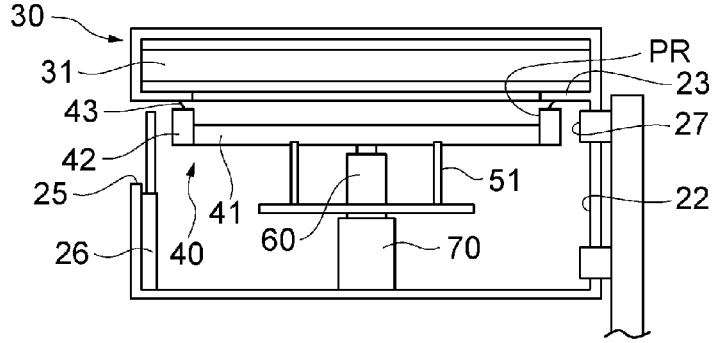
FIGS. 7A to 7D are views illustrating an operation of the etching unit from the carry-in of the substrate to the start of the thermal processing.

Subsequently, as an example of a substrate processing method, a control procedure of the etching unit U2 by the controller 100 will be described. Prior to the start of this procedure, the etching unit U2 is in a state where the shutter 26 closes the entrance 25 and the opening/closing mechanism 70 closes the processing chamber PR (see FIG. 7A).

Figure 6:
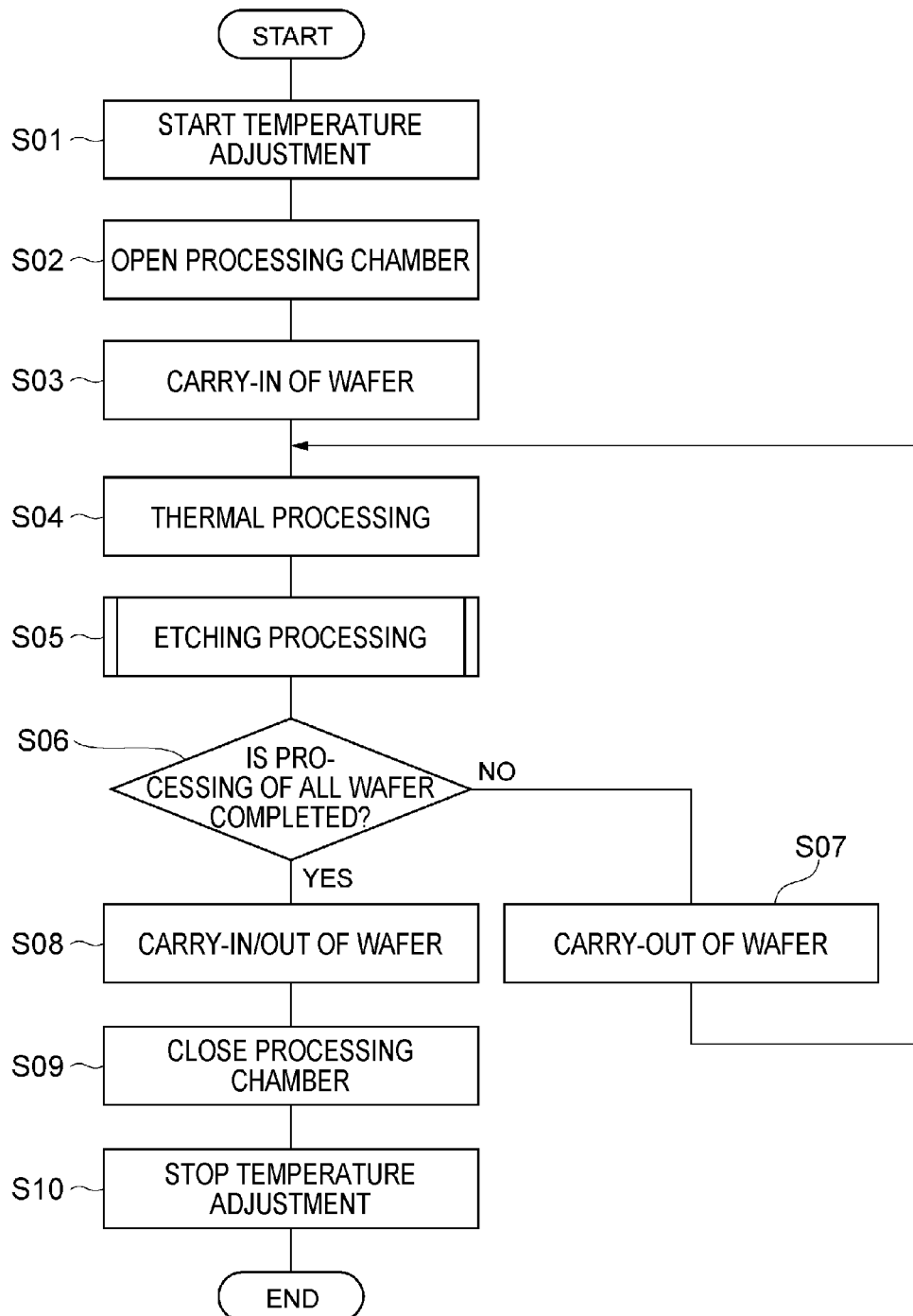
FIG. 6 is a flowchart illustrating a procedure of a processing by an etching unit.

FIG. 6 is a flowchart illustrating an exemplary control procedure of the etching unit U2 by the controller 100. First, the controller 100 executes step SO1. In step S01, the hot plate controller 111 controls the hot plate 41 to start temperature adjustment for heating the wafer W.

Figure 7B:
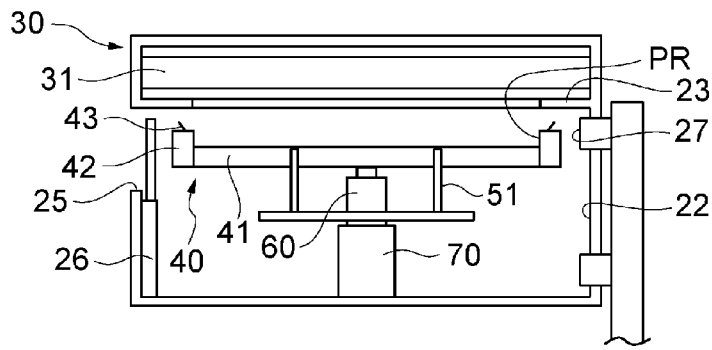

Next, the controller 100 executes step S02. In step S02, the ventilation controller 113 controls the opening/closing mechanism 70 to switch the state of the processing chamber PR from the closed state to the open state. For example, the carry-in/out controller 112 controls the opening/closing mechanism 70 to move down the first support unit 40 from a first position where the packing 43 is in contact with the partition wall 23 to a second position where the packing 43 is separated from the partition wall 23 (see FIG. 7B). Therefore, air flows from the outside of the processing chamber PR to the inside of the processing chamber PR and from the inside of the processing chamber PR to the inside of the processing chamber PR. Specifically, at least a part of the air flow flowing from the entrance 25 to the exhaust port 27 passes through the inside of the processing chamber PR.

Figure 7C:
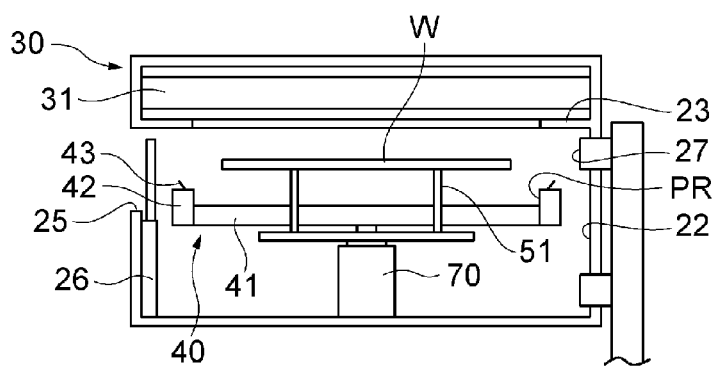
Figure 7D:
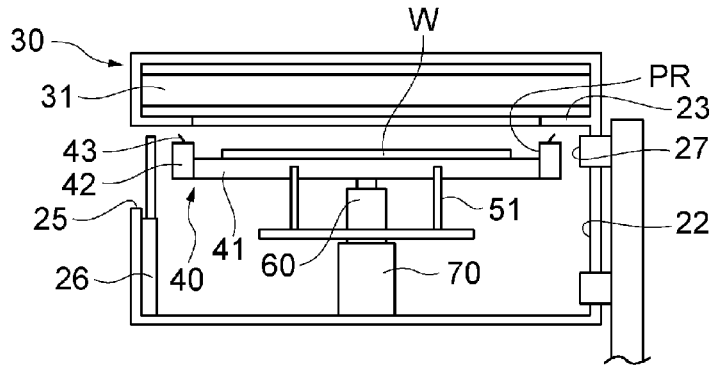

Next, the controller 100 executes step S03. In step S03, the carry-in/out controller 112 executes a control for carrying the wafer W into the second space 22. For example, the carry-in/out controller 112 controls the shutter 26 to switch the state of the entrance 25 from the closed state to the opened state, and controls the opening/closing mechanism 70 to move down the first support unit 40 to a third position that is lower than the second position. The third position is set such that the tip end portions of the supports pin 51 protrude from the upper surface of the hot plate 41. Thereafter, the carry-in/out controller 112 controls the delivery arm A2 to carry the wafer W into the second space 22 through the entrance 25 and horizontally dispose the wafer W on the support pins 51 (see FIG. 7C). Thereafter, the carry-in/out controller 112 controls the shutter 26 to switch the state of the entrance 25 from the open state to the closed state (see FIG. 7D).

Next, the controller 100 executes step S04. In step S04, the hot plate controller 111 moves up the first support unit 40 to a fourth position where the wafer W is able to be accommodated in the processing chamber PR (see FIG. 7D). The wafer W accommodated in the processing chamber PR is heated by the hot plate 41. The fourth position is set such that the processing chamber PR is in the open state. Therefore, during the execution of step S04, at least a part of the air flow flowing from the entrance 25 to the exhaust port 27 passes through the processing chamber PR, so that the inside of the processing chamber PR is continuously ventilated. The fourth position may be the same as the second position. Thereafter, the hot plate controller 111 waits for the lapse of a predetermined time. The predetermined time is set in advance by, for example, a preliminary actual machine test or simulations from the viewpoint of sufficient progress of the hard mask formation of the coating.

Next, the controller 100 executes step S04. In step S05, the ventilation controller 113, the irradiation controller 114, and the rotation controller 115 control the opening/closing mechanism 70, the irradiation unit 30, and the rotation driving unit 60, respectively, to execute the etching processing. The specific content of step S05 will be described later.

Next, the controller 100 executes step S06. In step S06, the carry-in/out controller 112 confirms whether the processing of all the wafers W to be processed has been completed.

In step S06, when it is determined that the processing of all the wafers W has not been completed, the controller 100 executes step S07. In step S07, the carry-in/out controller 112 carries a wafer W out from the second space 22, and executes a control for carrying a next wafer W into the second space 22. For example, the carry-in/out controller 112 controls the shutter 26 to switch the state of the entrance 25 from the closed state to the opened state, and controls the opening/closing mechanism 70 to move down the first support unit 40 to the third position. Thereafter, the carry-in/out controller 112 controls the delivery arm A2 to carry a wafer W out from the second space 22 through the entrance 25, carry a next wafer W into the second space 22 through the entrance 25, and then, horizontally dispose the next wafer on the support pins 51. Thereafter, the carry-in/out controller 112 controls the shutter 26 to switch the state of the entrance 25 from the open state to the closed state.

After the execution of step S07, the controller 100 returns the processing to step S04. Thereafter, the thermal processing and the etching processing are repeated until the processing of all the wafers W is completed.

In step S06, when it is determined that the processing of all the wafers W has been completed, the controller 100 executes step S08. In step S08, the carry-in/out controller 112 executes a control for carrying the wafer W out from the second space 22. For example, the carry-in/out controller 112 controls the shutter 26 to switch the state of the entrance 25 from the closed state to the opened state, and controls the opening/closing mechanism 70 to move down the first support unit 40 to the third position. Thereafter, the carry-in/out controller 112 controls the delivery arm A2 to carry the wafer W out from the second space 22 through the entrance 25. Thereafter, the carry-in/out controller 112 maintains the entrance 25 in the open state.

Next, the controller 100 executes step S09. In step S09, the ventilation controller 113 controls the opening/closing mechanism 70 to switch the state of the processing chamber PR from the open state to the closed state. For example, the ventilation controller 113 controls the opening/closing mechanism 70 to move up the first support unit 40 to the first position.

Next, the controller 100 executes step S10. In step S10, the hot plate controller 111 controls the hot plate 41 to stop the temperature adjustment for heating the wafer W. Then, the control procedure of the etching unit U2 by the controller 100 is completed.

Figure 8:
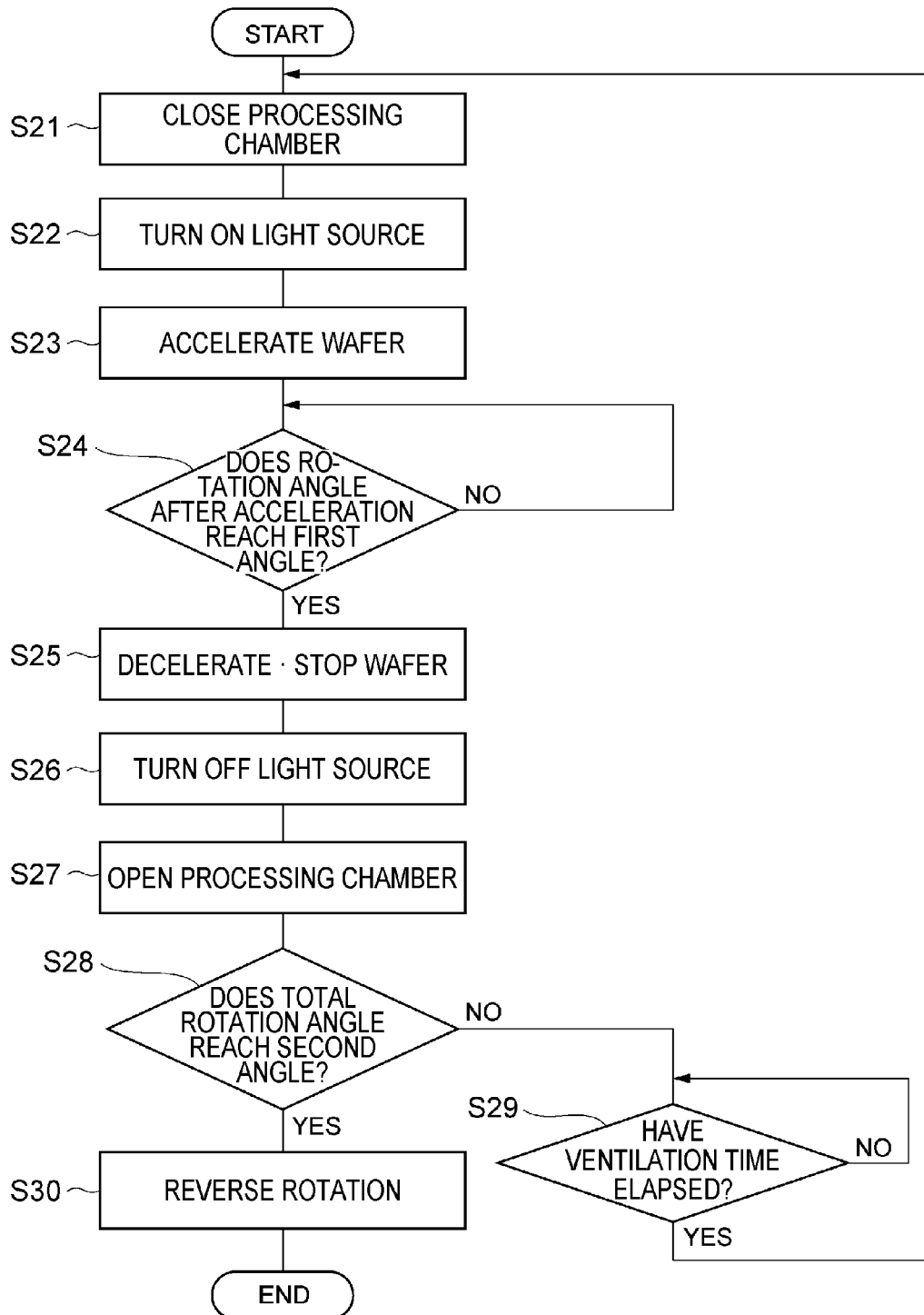
FIG. 8 is a flowchart illustrating an etching processing procedure.

Subsequently, the procedure of the etching processing in step S05 will be described. FIG. 8 is a flowchart illustrating a control procedure executed by the controller 100 in the etching processing (hereinafter, referred to as an "etching control procedure").

Figure 9A:
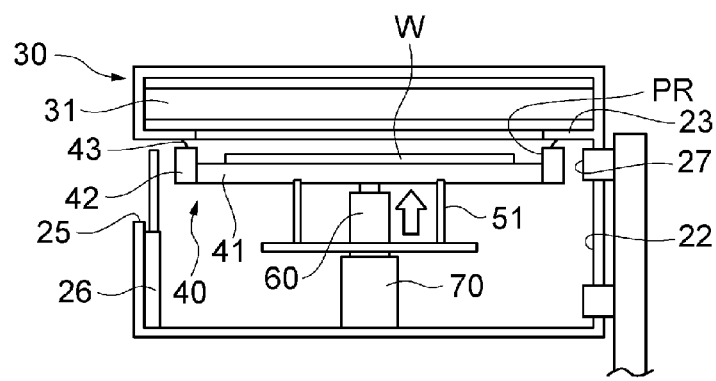
FIGS. 9A to 9C are views illustrating an operation of the etching unit in the etching processing.

First, the controller 100 executes step S21. In step S21, the ventilation controller 113 controls the opening/closing mechanism 70 to switch the state of the processing chamber PR from the open state to the closed state. For example, the ventilation controller 113 controls the opening/closing mechanism 70 to move up the first support unit 40 to the first position (see FIG. 9A).

Figure 9B:
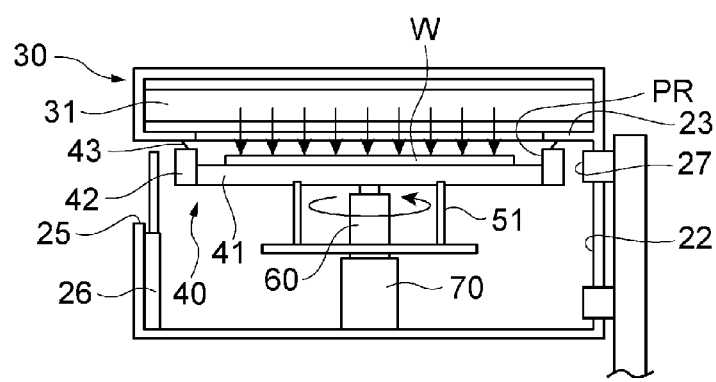

Next, the controller 100 executes step S22. In step S22, the irradiation controller 114 controls the irradiation unit 30 to turn on light source 31 (see FIG. 9B).

Next, the controller 100 executes step S23. In step S23, the rotation controller 115 controls the rotation driving unit 60 to start the rotation of the wafer W and the hot plate 41, and accelerate the rotation speed of the wafer W and the hot plate 41 to a predetermined speed. The predetermined speed is set in advance according to a first angle to be rotated at the speed (to be described) and a time at which the wafer W should be irradiated with the energy rays during the rotation at the speed (hereinafter, referred to as a "required irradiation time"). For example, the predetermined speed is a value obtained by dividing the first angle by the required irradiation time.

Next, the controller 100 executes step S24. In step S24, the rotation controller 115 waits for the rotation angle of the wafer W and the hot plate 41 at the predetermined speed to reach the first angle. The first angle is set in advance according to the number of times in which the inside of the processing chamber PR should be ventilated (hereinafter referred to as a "required ventilation frequency") before the total rotation angle of the wafer W reaches a second angle (to be described later). For example, the first angle is a value obtained by subtracting the rotation angle during the acceleration/deceleration of the wafer W and the hot plate 41 from the value obtained by dividing the second angle by the required ventilation frequency.

Next, the controller 100 executes step S25. In step S25, the rotation controller 115 controls the rotation driving unit 60 to decelerate the rotation speed of the wafer W and the hot plate 41 and stop the rotation of the wafer W and the hot plate 41.

Next, the controller 100 executes step S26. In step S26, the irradiation controller 114 controls the irradiation unit 30 to turn off light source 31.

Figure 9C:
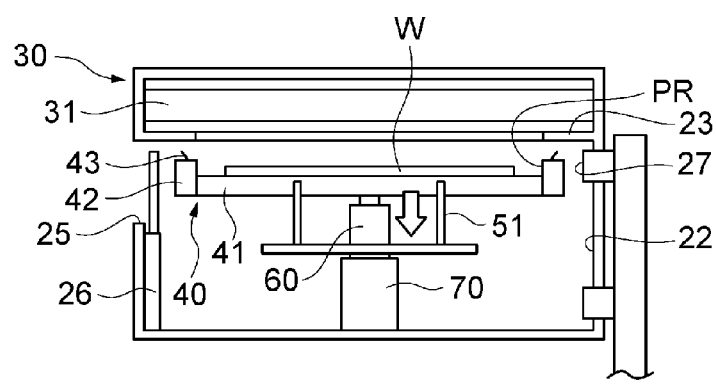

Next, the controller 100 executes step S27. In step S27, the ventilation controller 113 controls the opening/closing mechanism 70 to switch the state of the processing chamber PR from the closed state to the open state. For example, the ventilation controller 113 controls the opening/closing mechanism 70 to move down the first support unit 40 to the fourth position (see FIG. 9C). Therefore, at least a part of the air flow flowing from the entrance 25 to the exhaust port 27 passes through the processing chamber PR, so that the inside of the processing chamber PR is ventilated.

Next, the controller 100 executes step S28. In step S28, the rotation controller 115 confirms whether the total rotation angle of the wafer W has reached the second angle. The second angle is set according to a structural constraint condition. The constraint condition includes, for example, a length of a cable for supplying power to the hot plate 41.

In step S28, when it is determined that the total rotation angle has not reached the second angle, the controller 100 executes step S29. In step S29, the ventilation controller 113 waits for the elapse of a predetermined ventilation time. The ventilation time is set in advance by a theoretical formula, simulation, or actual machine test from the viewpoint of sufficiently ventilating the processing chamber PR. A state in which the processing chamber PR is sufficiently ventilated is, for example, a case where the composition of the gas in the processing chamber PR becomes substantially equal to the composition of the gas in the processing chamber PR before turning on the light source 31 (step S22).

After the execution of step S29, the controller 100 returns the processing to step S21. Thereafter, until the total rotation angle of the wafer W reaches the second angle, radiating the energy rays to the wafer W from the light source 31 while rotating the wafer W in the processing chamber PR, and ventilating the inside of the processing chamber PR in a state where the light source 31 is turned off are repeated in a constant cycle.

In step S28, when it is determined that the total rotation angle of the wafer W has reached the second angle, the controller 100 executes step S30.

In step S30, the rotation controller 115 controls the rotation driving unit 60 to reversely rotate the wafer W and the hot plate 41 until the state before step S23 is executed for the first time. For example, the rotation controller 115 controls the rotation driving unit 60 to reversely rotate the wafer W and the hot plate 41 at the same rotation angle as the total rotation angle. Then, the etching processing is completed.

[Modification 1]

When the rotation of the wafer W and the hot plate 41 is started in synchronization with the turn-on of the light source 31, the controller 100 may control the rotation driving unit 60 to start the rotation of the wafer W and the hot plate 41 before turning on the light source 31. In addition, when the rotation of the wafer W and the hot plate 41 is stopped in synchronization with the turn-off of the light source 31, the controller 100 may control the rotation driving unit 60 to stop the rotation of the wafer W and the hot plate 41 after turning off the light source 31. For example, the controller 100 may be configured to start acceleration of the wafer W in step S23 before turning on the light source 31 in step S22, and execute step S26 before stopping the wafer W in step S25.

In this case, before the rotation of the wafer W and the hot plate 41 starts after the rotation of the wafer W and the hot plate 41 is stopped, the controller 100 may be further configured to control the rotation driving unit 60 to reversely rotate the wafer W and the hot plate 41 until the wafer W returns to the position before the light source 31 is turned off.

When the rotation of the wafer W and the hot plate 41 is stopped in synchronization with the turn-off of the light source 31, the controller 100 may control the rotation driving unit 60 to start deceleration of the wafer W and the hot plate 41 at the time of or after turning off the light source 31. In addition, when the rotation of the wafer W and the hot plate 41 is started in synchronization with the turn-on of the light source 31, the controller 100 may control the rotation driving unit 60 to accelerate the wafer W and the hot plate 41 under conditions that the acceleration of the wafer W and the hot plate 41 is completed at the time of or before turning on the light source 31 and a position of the wafer W at the time of the turn-on of the light source 31 and a position of the wafer W at the time of the turn-off of the light source 31 coincide with each other.

Figure 10:
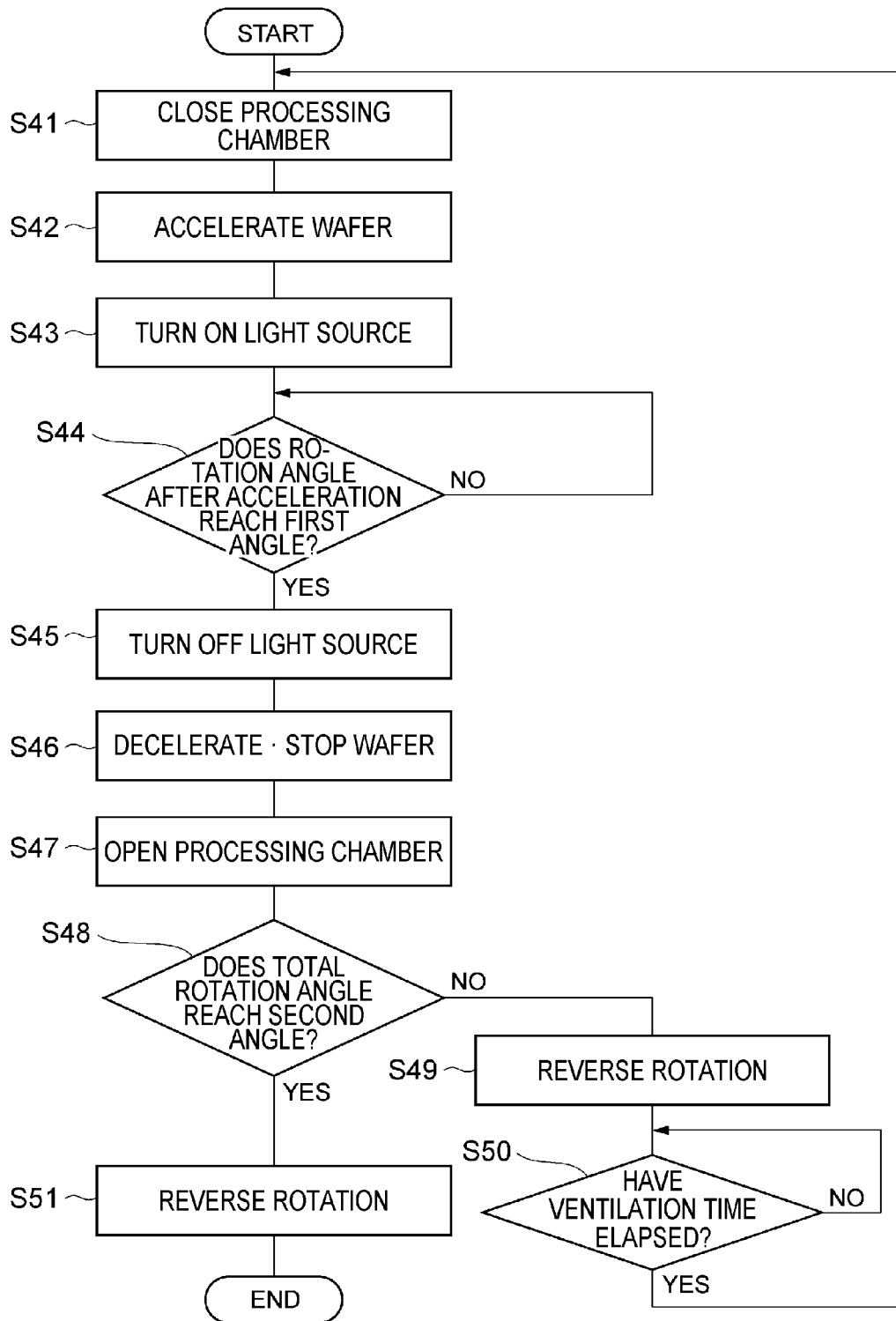
FIG. 10 is a flowchart illustrating a modification of the etching processing procedure.

FIG. 10 is a flowchart specifically illustrating the modification. Steps S41 to S47 in FIG. 10 are the same as the above-described steps S21 to S27 except for the followings.

i) The execution order of step S42 (acceleration of the wafer W and the hot plate 41) corresponding to step S23 and step S43 (turning-on of the light source 31) corresponding to step S22 are reversed from the execution order of steps S22 and S23. That is, the controller 100 controls the rotation driving unit 60 to complete the acceleration of the wafer W and the hot plate 41 immediately before the light source 31 is turned on.

ii) The execution order of step S45 (turning-off of the light source 31) corresponding to step S26 and step S46 (deceleration of the wafer W and the hot plate 41) corresponding to step S25 are reversed from the execution order of steps S25 and S26. That is, the controller 100 controls the rotation driving unit 60 to start the deceleration of the wafer W and the hot plate 41 immediately after the light source 31 is turned off.

Figure 11A:
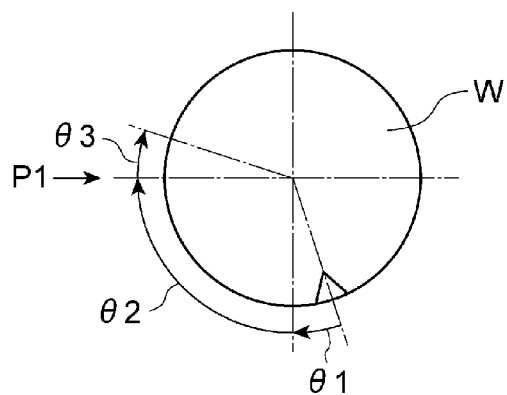
FIGS. 11A to 11C are views each illustrating a rotation angle of the substrate in the procedure of FIG. 10.

FIG. 11A schematically illustrates the movement of the wafer W in steps S41 to S47. An angle θ1 is a rotation angle during the acceleration in step S42, an angle θ2 is a rotation angle in step S44 (first angle), and an angle θ3 is a rotation angle during the deceleration in step S46.

Referring back to FIG. 10, the controller 100 then executes step S48 which is the same as step S28. Similarly to step S28, in step S48, the rotation controller 115 confirms whether the total rotation angle of the wafer W has reached the second angle.

In step S48, when it is determined that the total rotation angle has not reached the second angle, the controller 100 executes step S49. In step S49, the rotation controller 115 controls the rotation driving unit 60 to reversely rotate the wafer W and the hot plate 41 until the wafer W returns to the position before turning off the light source 31 (step S45).

Figure 11B:
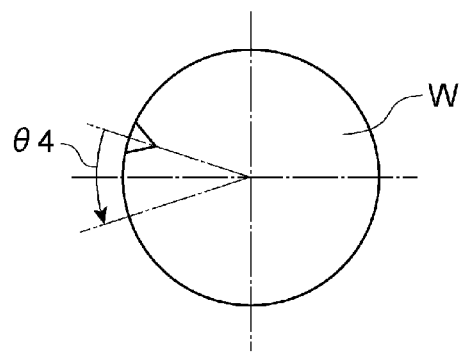

FIG. 11B schematically illustrates the movement of the wafer W in steps S49, and an angle θ4 is an angle of reverse rotation in step S49. The angle θ4 is equivalent to, for example, the sum of the angles θ1 and θ2.

Referring back to FIG. 10, the controller 100 then executes step S50 which is the same as step S29. In step S50, the ventilation controller 113 waits for the elapse of the ventilation time.

After the execution of step S50, the controller 100 returns the processing to step S41. Thereafter, until the total rotation angle of the wafer W reaches the second angle, radiating the energy rays to the wafer W from the light source 31 while rotating the wafer W in the processing chamber PR after the acceleration of the wafer W is completed, decelerating and stopping the wafer W after the light source 31 is turned off, reversely rotating the wafer W to the position before the light source 31 is turned off, and ventilating the inside of the processing chamber PR are repeated in a constant cycle.

Figure 11C:
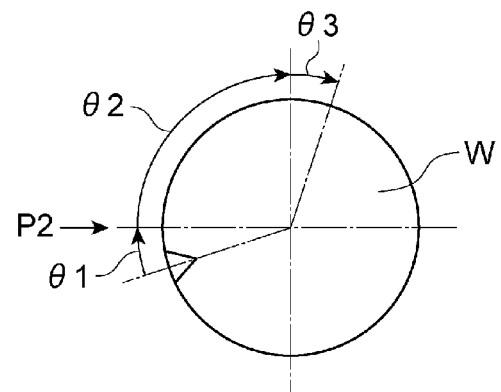

FIG. 11C schematically illustrates the movement of the wafer W when steps S41 to S47 are executed after the state of FIG. 11B. As described above, the angle θ4 is equivalent to the sum of the angles θ1 and θ2. Therefore, a position P2 of the wafer W at the time of the turn-on of the light source 31 (step S43) and a position P1 of the wafer W at the time of the previous turning-off of the light source 31 (step S45) coincide with each other. That is, the controller 100 controls the rotation driving unit 60 to accelerate the wafer W and the hot plate 41 under the condition where the position of the wafer W at the time of the turn-on of the light source 31 and the position of the wafer W at the time of the turn-off of the light source 31 coincide with each other.

In step S48, when it is determined that the total rotation angle of the wafer W has reached the second angle, the controller 100 executes step S51. In step S51, the rotation controller 115 controls the rotation driving unit 60 to reversely rotate the wafer W and the hot plate 41 until the state before step S42 is executed for the first time. For example, the rotation controller 115 controls the rotation driving unit 60 to reversely rotate the wafer W and the hot plate 41 at the same rotation angle as the total rotation angle. Then, the etching processing of FIG. 10 is completed.

[Modification 2]

The controller 100 may be configured to perform a first rotation control of controlling the rotation driving unit 60 to rotate the wafer W and the hot plate 41 together in a first direction, stop the rotation of the wafer W and the hot plate 41 in the first direction in synchronization with the turn-off of the light source 31, and re-start the rotation of the wafer W and the hot plate 41 in the first direction in synchronization with the turn-on of the light source 31, and a second rotation control of controlling the rotation driving unit 60 to rotate the wafer W and the hot plate 41 together in a second direction opposite to the first direction, stop the rotation of the wafer W and the hot plate 41 in the second direction in synchronization with the turn-off of the light source 31, and re-start the rotation of the wafer W and the hot plate 41 in the second direction in synchronization with the turn-on of the light source 31, under a condition where a stop position of the wafer W in the first rotation control and a stop position of the wafer W in the second rotation control are different from each other.

Further, the controller 100 may be configured to perform the first rotation control and the second rotation control such that a rotation range of the wafer W during the acceleration and deceleration in the first rotation control and a rotation range of the wafer W during the acceleration and deceleration in the second rotation control do not overlap with each other.

Further, the controller 100 may be configured to control the rotation driving unit 60 to repeat the rotation of the wafer W and the hot plate 41 in the first direction and the stop of the rotation in a constant cycle in the first rotation control, and control the rotation driving unit 60 to repeat the rotation of the wafer W and the hot plate 41 in the second direction and the stop of the rotation in a constant cycle in the second rotation control.

Figure 12:
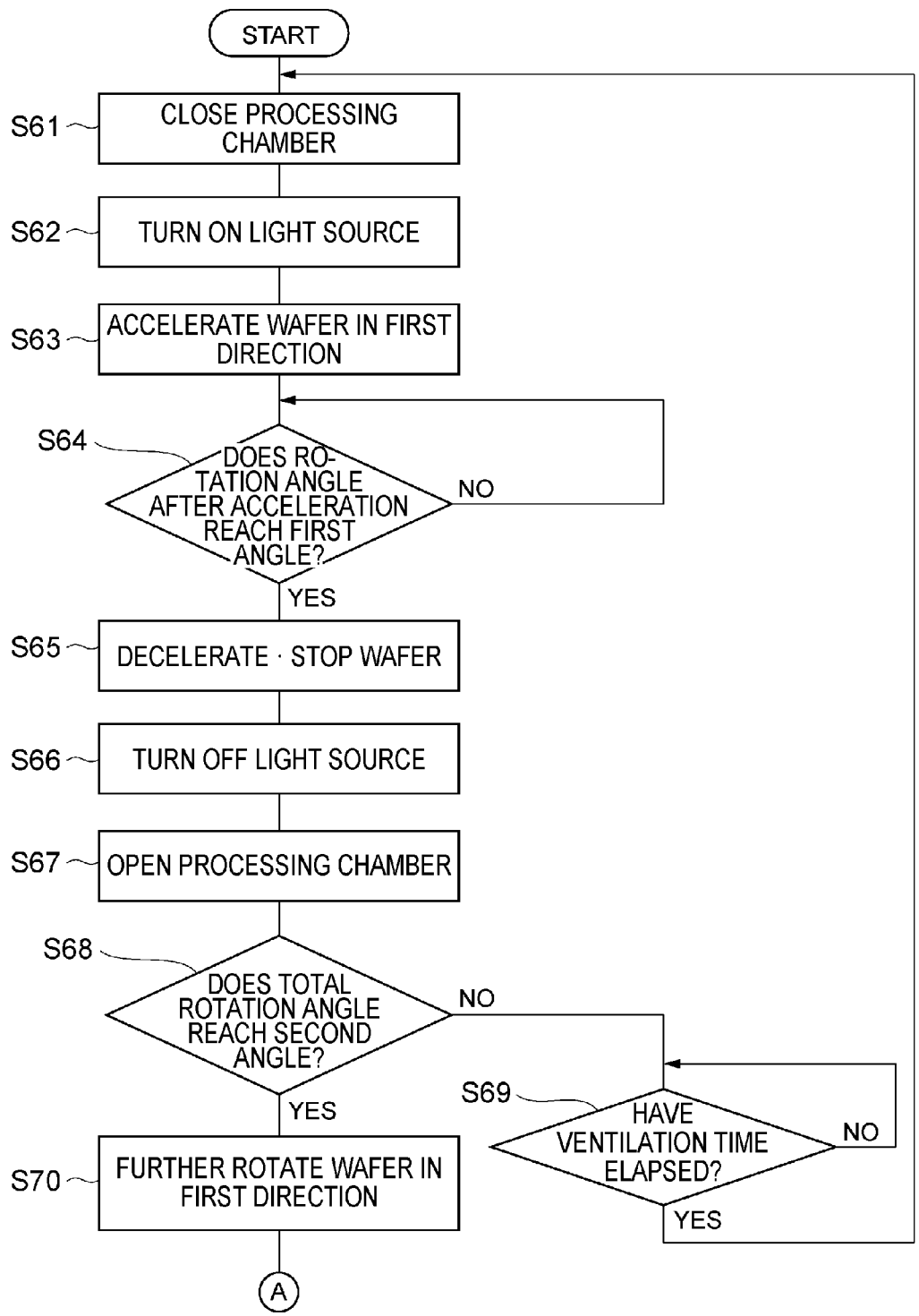
FIG. 12 is a flowchart illustrating another modification of the etching processing procedure.
Figure 13:
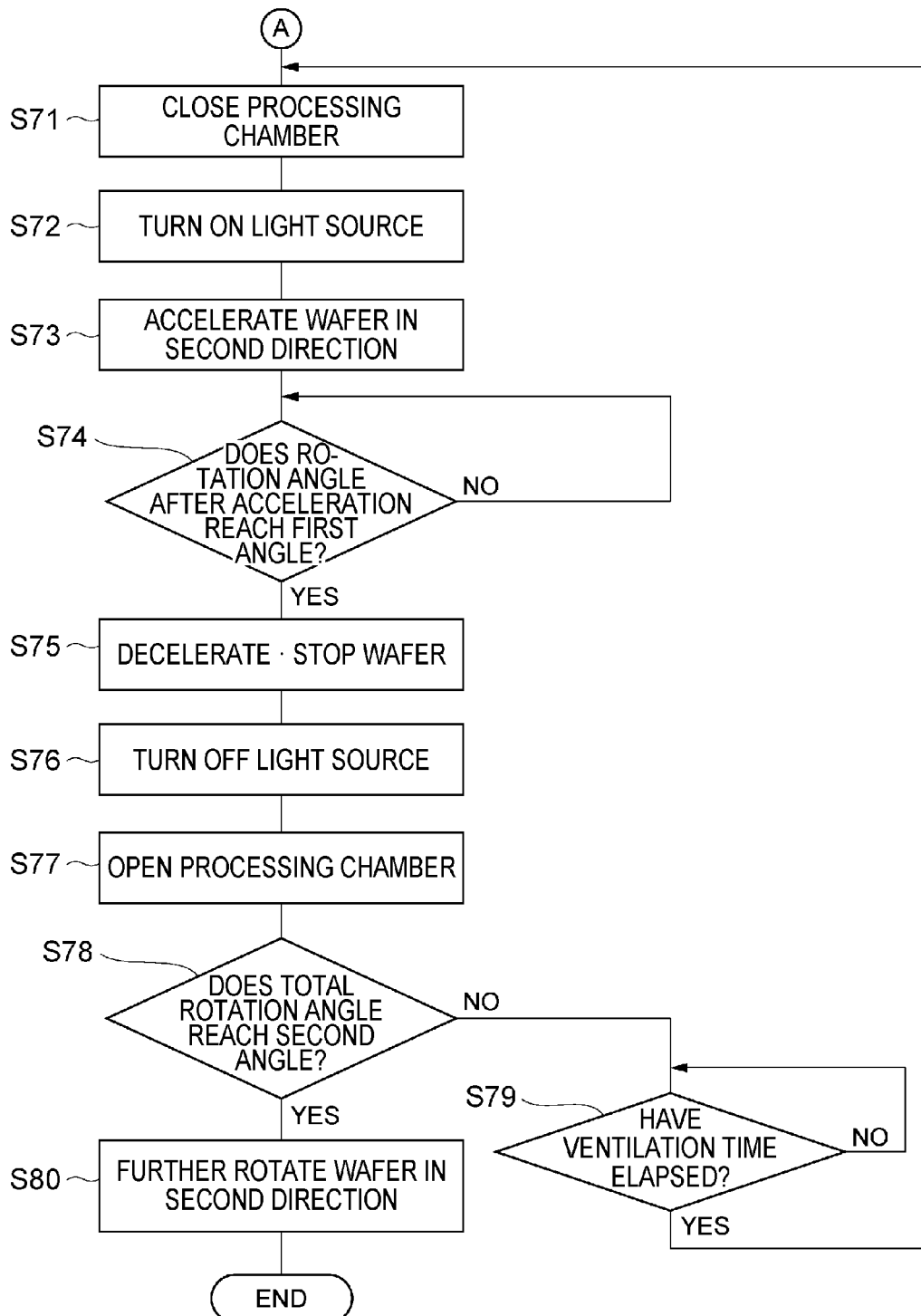
FIG. 13 is a flowchart illustrating a procedure subsequent to FIG. 12.

FIGS. 12 and 13 are flowcharts specifically illustrating the modification. Steps S61 to S69 in FIG. 12 are an example of the first rotation control and are substantially the same as the above-described steps S21 to S29. For convenience, the rotation direction of the wafer W in steps S61 to S69 is set as the first direction.

In step S68, the rotation controller 115 confirms whether the total rotation angle of the wafer W in the first direction has reached the second angle. The controller 100 repeats steps S61 to S69 in a constant cycle until the total rotation angle reaches the second angle.

In step S68, when it is determined that the total rotation angle of the wafer W in the first direction has reached the second angle, the controller 100 executes step S70. In step S70, the rotation controller 115 controls the rotation driving unit 60 to further rotate the wafer W in the first direction in a state where the light source 31 is turned off. The rotation angle of the wafer W in step S70 will be described later.

Next, the controller 100 changes the rotation direction of the wafer W to a second direction opposite to the first direction, and executes steps S71 to S80. Steps S71 to S79 are an example of the second rotation control and are the same as steps S61 to S69 except that the rotation direction of the wafer W is the second direction.

In step S78, the rotation controller 115 confirms whether the total rotation angle of the wafer W in the second direction has reached the second angle. The controller 100 repeats steps S71 to S79 in a constant cycle until the total rotation angle reaches the second angle.

In step S78, when it is determined that the total rotation angle of the wafer W in the second direction has reached the second angle, the controller 100 executes step S80. In step S80, the rotation controller 115 controls the rotation driving unit 60 to further rotate the wafer W in the second direction in a state where the light source 31 is turned off. The rotation angle of the wafer W in step S80 is the same as the rotation angle of the wafer W in step S70. Then, the etching processing of FIGS. 12 and 13 is completed.

Figure 14A:
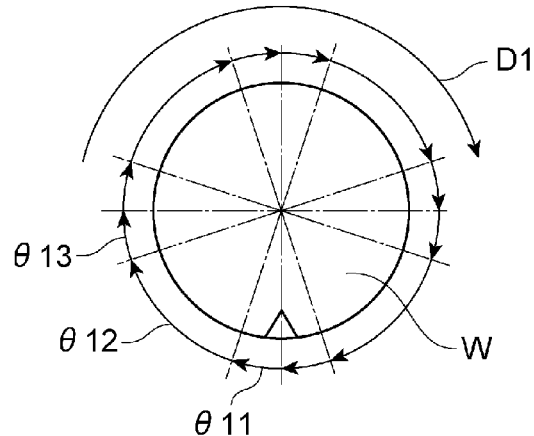
FIGS. 14A to 14C are views each illustrating a rotation angle of a substrate in the procedures of FIGS. 12 and 13.
Figure 14B:
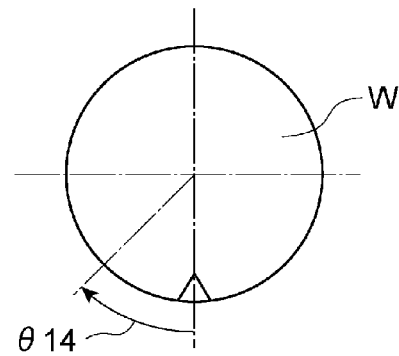
Figure 14C:
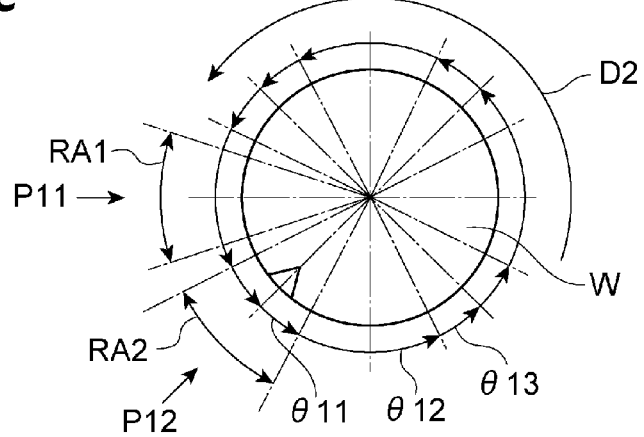

FIG. 14A schematically illustrates the movement of the wafer W in steps S61 to S69. In steps S61 to S69, the wafer W rotates in a first direction D1. An angle θ11 is a rotation angle during the acceleration in step S63, an angle θ12 is a rotation angle in step S64 (first angle), and an angle θ13 is a rotation angle during the deceleration in step S65. FIG. 14B schematically illustrates the movement of the wafer W in step S70. In step S70, the wafer W rotates in a first direction D1. The angle θ14 is a rotation angle of the wafer W in step S70. FIG. 14C schematically illustrates the movement of the wafer W in steps S71 to S79. In steps S71 to S79, the wafer W rotates in a second direction D2.

The relationship between a stop position P11 of the wafer W in step S65 and a stop position P12 of the wafer W in step S75 may be adjusted by setting the angle θ14. The relationship between a rotation range RA1 of the wafer W during acceleration in step S63 and deceleration in step S65 and a rotation range RA2 of the wafer W during deceleration in step S73 and acceleration in step S73 may also be adjusted by setting the angle θ14. The angle θ14 is set such that the stop position P11 and the stop position P12 are different from each other and is set such that the rotation range RA1 and the rotation range RA2 do not overlap with each other.

Since the controller 100 may be configured to execute the first rotation control and the second rotation control under the condition where the stop position P11 and the stop position P12 are different from each other, the specific method is not limited to that described above. Further, the method of preventing the rotation range RA1 and the rotation range RA2 from overlapping is not limited to that described above. For example, the controller 100 may be configured to set the stop position P11 and the stop position P12 to be displaced from each other and avoid overlapping of the rotation range RA1 and the rotation range RA2 by appropriately changing the angles θ11, θ12, and θ13 in FIG. 14 without executing step S70.

<Effect of the Present Exemplary Embodiment>

The substrate processing apparatus 1 includes: a processing chamber PR configured to accommodate a wafer W; a light source configured to radiate energy rays for a processing to the wafer W in the processing chamber PR; a rotation driving unit 60 configured to rotate at least one of the wafer W and the light source 31 around an axis intersecting with the wafer W in the processing chamber PR; an opening/closing mechanism 70 configured to switch between an open state where an air flow is allowed to pass from an outside of the processing chamber PR to an inside of the processing chamber PR and from the inside of the processing chamber PR to the outside of the processing chamber PR and a closed state where the air flow is interrupted; and a controller 100 configured to control the opening/closing mechanism 70 to switch between the open state and the closed state, to increase a light emission amount of the light source 31 in synchronization with the switch of the open state to the closed state by the opening/closing mechanism 70, and to decrease the light emission amount of the light source 31 in synchronization with the switch of the closed state to the open state by the opening/closing mechanism 70.

According to the substrate processing apparatus 1, since at least one of the wafer W in the processing chamber PR and the light source 31 is rotated by the rotation driving unit 60, unevenness of the intensity of the energy rays reaching each part of the wafer W from the light source 31 (hereinafter, referred to as an "illuminance spot") is reduced. Here, it is expected that the processing unevenness caused by the air flow (processing unevenness caused by the air flow in the processing chamber PR) is also reduced by the rotation of at least one of the wafer W and the light source 31. However, the present inventors have found that even when at least one of the wafer W and the light source 31 is rotated, the processing unevenness caused by an air flow for ventilation in the processing chamber PR may not be sufficiently reduced in some cases. Therefore, the substrate processing apparatus 1 further includes the opening/closing mechanism 70 and the controller 100, and the controller 100 is configured to control the opening/closing mechanism 70 to switch between the open state and the closed state, to increase a light emission amount of the light source 31 in synchronization with the switch of the open state to the closed state by the opening/closing mechanism 70, and to decrease the light emission amount of the light source 31 in synchronization with the switch of the closed state to the open state by the opening/closing mechanism 70. As a result, it is possible to reduce the processing unevenness caused by the air flow which is not reduced by the rotation of the wafer W. Therefore, it is possible to further enhance the uniformity of the degree of progress of the processing by irradiation with energy rays.

The substrate processing apparatus 1 may further includes a hot plate 41 configured to heat the wafer W in the processing chamber PR, the rotation driving unit 60 may be configured to rotate the wafer W and the hot plate 41 together, and the controller 100 may be further configured to control the rotation driving unit 60 to increase a rotation speed of the wafer W and the hot plate 41 in synchronization with an increase in the light emission amount of the light source 31 and to control the rotation driving unit 60 to decrease the rotation speed of the wafer W and the hot plate 41 in synchronization with a decrease in the light emission amount of the light source 31.

In this case, since the rotation speed of the wafer W and the hot plate 41 is decreased at the time of the decrease in the light emission amount of the light source 31, it is possible to reduce the total rotation angle of the wafer W and the hot plate 41. As a result, it is possible to simplify the configuration for continuing the energy supply to the hot plate 41 during the rotation. For example, it is possible to continue supplying power to the hot plate 41 by wire without using a movable contact such as, for example, a brush.

The controller 100 may be further configured to, when increasing the rotation speed of the wafer W and the hot plate 41 in synchronization with the increase in the light emission amount of the light source 31, control the rotation driving unit 60 to increase the rotation speed of the wafer W and the hot plate 41 before the increase in the light emission amount of the light source 31; when decreasing the rotation speed of the wafer W and the hot plate 41 in synchronization with the decrease in the light emission amount of the light source 31, control the rotation driving unit 60 to decrease the rotation speed of the wafer W and the hot plate 41 after the decrease in the light emission amount of the light source 31; and before the rotation speed of the wafer W and the hot plate 41 increases after the rotation speed of the wafer W and the hot plate 41 decreases, controls the rotation driving unit 60 to reversely rotate the wafer W and the hot plate 41 until the wafer W returns to a position before the light emission amount of the light source 31 is decreased.

In this case, since the rotation speed of the wafer W and the hot plate 41 before the increase in the light emission amount of the light source 31 and the rotation speed of the wafer W and the hot plate 41 is decreased after the decrease in the light emission amount of the light source 31, the progress of the processing is reduced during the acceleration/deceleration in which the rotation speed of the wafer W is not stabilized. Before the rotation speed of the wafer W and the hot plate 41 increases after the rotation speed of the wafer W and the hot plate 41 decreases, since the wafer W and the hot plate 41 are reversely rotated until the wafer W returns to a position before the light emission amount of the light source 31 is decreased, the difference between the position of the wafer W at the time of the decrease in the light emission amount of the light source 31 and the position of the wafer W at the time of the increase in the light emission amount of the light source 31 is reduced. Therefore, since an illuminance spot caused by the acceleration/deceleration of the rotation of the wafer W is reduced, it is possible to further enhance the uniformity of the degree of progress of the processing by irradiation with energy rays.

When decreasing the rotation speed of the wafer W and the hot plate 41 in synchronization with the decrease in the light emission amount of the light source 31, the controller 100 may control the rotation driving unit 60 to start decreasing the rotation speed of the wafer W and the hot plate 41 at the time of or after the decrease in the light emission amount of the light source 31, and when increasing the rotation speed of the wafer W and the hot plate 41 in synchronization with the increase in the light emission amount of the light source 31, the controller 100 may control the rotation driving unit 60 to increase the rotation speed of the wafer W and the hot plate 41 under conditions that the increase in the rotation speed of the wafer W and the hot plate 41 is completed at the time of or before the increase in the light emission amount of the light source 31 and that a position of the wafer W at the time of the increase in the light emission amount of the light source 31 and a position of the wafer W at the time of the decrease in the light emission amount of the light source 31 coincide with each other.

In this case, the progress of the processing is further reduced during the increase and decrease of the rotation speed, and the difference between the position of the wafer W at the time of the decrease in the light emission amount of the light source 31 and the position of the wafer W at the time of the increase in the light emission amount of the light source 31 is further reduced. Therefore, since an illuminance spot caused by the increase and decrease in the rotation speed of the wafer W is further reduced, it is possible to further enhance the uniformity of the degree of progress of the processing by irradiation with energy rays.

The controller 100 may be configured to perform a first rotation control of controlling the rotation driving unit 60 to rotate the wafer W and the hot plate 41 together in a first direction, decrease the rotation speed of the wafer W and the hot plate 41 in the first direction in synchronization with the decrease in the light emission amount of the light source 31, and increase the rotation speed of the wafer W and the hot plate 41 in the first direction in synchronization with the increase in the light emission amount of the light source 31, and a second rotation control of controlling the rotation driving unit 60 to rotate the wafer W and the hot plate 41 together in a second direction opposite to the first direction, decrease the rotation speed of the wafer W and the hot plate 41 in the second direction in synchronization with the decrease in the light emission amount of the light source 31, and increase the rotation speed of the wafer W and the hot plate 41 in the second direction in synchronization with the increase in the light emission amount of the light source 31, under a condition where a position P11 of the wafer W at the time when the decrease in the rotation speed is completed in the first rotation control and a position P12 of the wafer W at the time when the decrease in the rotation speed is completed in the second rotation control are different from each other.

In this case, since an illuminance spot caused by the increase and decrease in the rotation speed of the wafer W is reduced by setting the position P11 and the position P12 to be displaced from each other, it is possible to further enhance the uniformity of the degree of progress of the processing by irradiation with energy rays.

The controller 100 may be configured to perform the first rotation control and the second rotation control such that a rotation range RA1 of the wafer W during the increase and decrease in the rotation speed in the first rotation control and a rotation range RA2 of the wafer W during the increase and decrease in the rotation speed in the second rotation control do not overlap with each other.

In this case, since an illuminance spot caused by the increase and decrease in the rotation speed of the wafer W is further reduced by setting the rotation ranges RA1 and RA2 not to overlap with each other, it is possible to further enhance the uniformity of the degree of progress of the processing by irradiation with energy rays.

The controller 100 may be configured to perform the first rotation control to repeat the increase and the decrease in the rotation speed of the wafer W and the hot plate 41 in the first direction in a constant cycle, and perform the second rotation control to repeat the increase and the decrease in the rotation speed of the wafer W and the hot plate 41 in the second direction in the constant cycle.

In this case, it is possible to repeat the increase and the decrease in the rotation speed of the wafer W and the hot plate 41 in the first direction in a constant cycle and to switch between the closed state and the open state by the opening/closing mechanism 70 in a constant cycle, so that processing unevenness caused by the variation of the ventilation cycle is reduced. Therefore, it is possible to further enhance the uniformity of the degree of progress of the processing by irradiation with energy rays.

Although the exemplary embodiments have been described above, the present disclosure is not necessarily limited to the above-described exemplary embodiments, and various modifications are possible without departing from the gist thereof. For example, the rotation driving unit 60 may rotate the light source 31 in place of the wafer W and the hot plate 41. The above-described configuration may also be applied to irradiation with energy rays to an organic film such as, for example, a resist film. The processing target substrate is not limited to a semiconductor wafer, and may be, for example, a glass substrate, a mask substrate, or a flat panel display (FPD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing chamber configured to accommodate a substrate;
a light source configured to radiate light to the substrate in the processing chamber;
a rotation driver configured to rotate at least one of the substrate and the light source around an axis intersecting with the substrate in the processing chamber;
an actuator configured to switch between an open state where an air flow is allowed to pass from an outside of the processing chamber to an inside of the processing chamber and from the inside of the processing chamber to the outside of the processing chamber and a closed state where the air flow is interrupted; and
a controller configured to control the actuator to switch between the open state and the closed state, to increase a light emission amount of the light source in synchronization with the switch of the open state to the closed state by the actuator, and to decrease the light emission amount of the light source in synchronization with the switch of the closed state to the open state by the actuator.

2. The substrate processing apparatus of claim 1, further comprising:
a hot plate configured to heat the substrate in the processing chamber,
wherein the rotation driver is configured to rotate the substrate and the hot plate together, and
the controller is further configured to control the rotation driver to increase a rotation speed of the substrate and the hot plate in synchronization with the increase in the light emission amount of the light source and to control the rotation driver to decrease the rotation speed of the substrate and the hot plate in synchronization with the decrease in the light emission amount of the light source.

3. The substrate processing apparatus of claim 2, wherein the controller is further configured:
when increasing the rotation speed of the substrate and the hot plate in synchronization with the increase in the light emission amount of the light source, to control the rotation driver to increase the rotation speed of the substrate and the hot plate before the increase in the light emission amount of the light source,
when decreasing the rotation speed of the substrate and the hot plate in synchronization with the decrease in the light emission amount of the light source, to control the rotation driver to decrease the rotation speed of the substrate and the hot plate after the decrease in the light emission amount of the light source, and
before the rotation speed of the substrate and the hot plate increases after the rotation speed of the substrate and the hot plate decreases, to control the rotation driver to reversely rotate the substrate and the hot plate until the substrate returns to a position before the light emission amount of the light source is decreased.

4. The substrate processing apparatus of claim 3, wherein the controller is configured:
when decreasing the rotation speed of the substrate and the hot plate in synchronization with the decrease in the light emission amount of the light source, to control the rotation driver to start decreasing the rotation speed of the substrate and the hot plate at the time of or after the decrease in the light emission amount of the light source, and when increasing the rotation speed of the substrate and the hot plate in synchronization with the increase in the light emission amount of the light source, to control the rotation driver to increase the rotation speed of the substrate and the hot plate under conditions that the increase in the rotation speed of the substrate and the hot plate is completed at the time of or before the increase in the light emission amount of the light source and that a position of the substrate at the time of the increase in the light emission amount of the light source and a position of the substrate at the time of the decrease in the light emission amount of the light source coincide with each other.

5. The substrate processing apparatus of claim 2, wherein the controller is configured:
to perform a first rotation control of controlling the rotation driver to rotate the substrate and the hot plate together in a first direction, decrease the rotation speed of the substrate and the hot plate in the first direction in synchronization with the decrease in the light emission amount of the light source, and increase the rotation speed of the substrate and the hot plate in the first direction in synchronization with the increase in the light emission amount of the light source, and
to perform a second rotation control of controlling the rotation driver to rotate the substrate and the hot plate together in a second direction opposite to the first direction, decrease the rotation speed of the substrate and the hot plate in the second direction in synchronization with the decrease in the light emission amount of the light source, and increase the rotation speed of the substrate and the hot plate in the second direction in synchronization with the increase in the light emission amount of the light source,
wherein the controller is configured to perform the first rotation control and the second rotation control under a condition where a position of the substrate at the time when the decrease in the rotation speed is completed in the first rotation control and a position of the substrate at the time when the decrease in the rotation speed is completed in the second rotation control are different from each other.

6. The substrate processing apparatus of claim 5, wherein the controller is configured to perform the first rotation control and the second rotation control such that a rotation range of the substrate during the increase and decrease in the rotation speed in the first rotation control and a rotation range of the substrate during the increase and decrease in the rotation speed in the second rotation control do not overlap with each other.

7. The substrate processing apparatus of claim 5, wherein the controller is configured:
to perform the first rotation control to repeat the increase and the decrease in the rotation speed of the substrate and the hot plate in the first direction in a constant cycle, and
to perform the second rotation control to repeat the increase and the decrease in the rotation speed of the substrate and the hot plate in the second direction in the constant cycle.

8. A substrate processing method comprising:
accommodating a substrate in a processing chamber;
radiating to the substrate in the processing chamber with light from a light source;
rotating at least one of the substrate and the light source around an axis intersecting with the substrate in the processing chamber;

switching between an open state where an air flow is allowed to pass from an outside of the processing chamber to an inside of the processing chamber and from the inside of the processing chamber to the outside of the processing chamber and a closed state where the air flow is interrupted using an actuator;

increasing a light emission amount of the light source in synchronization with the switch of the open state to the closed state; and decreasing the light emission amount of the light source in synchronization with the switch of the closed state to the open state.

9. The substrate processing method of claim 8, further comprising:

heating the substrate in the processing chamber with a hot plate;

rotating the substrate and the hot plate together;

increasing a rotation speed of the substrate and the hot plate in synchronization with the increase in the light emission amount of the light source; and decreasing the rotation speed of the substrate and the hot plate in synchronization with the decrease in the light emission amount of the light source.

10. The substrate processing method of claim 9, further comprising:

when increasing the rotation speed of the substrate and the hot plate in synchronization with the increase in the light emission amount of the light source, increasing the rotation speed of the substrate and the hot plate before the increase in the light emission amount of the light source;

when decreasing the rotation speed of the substrate and the hot plate in synchronization with the decrease in the light emission amount of the light source, decreasing the rotation speed of the substrate and the hot plate after the decrease in the light emission amount of the light source; and before the rotation speed of the substrate and the hot plate increases after the rotation speed of the substrate and the hot plate decreases, reversely rotating the substrate and the hot plate until the substrate returns to a position before the light emission amount of the light source is decreased.

11. The substrate processing method of claim 10, wherein, when decreasing the rotation speed of the substrate and the hot plate in synchronization with the decrease in the light emission amount of the light source, the decrease in the rotation speed of the substrate and the hot plate is started at the time of or after the decrease in the light emission amount of the light source, and when increasing the rotation speed of the substrate and the hot plate in synchronization with the increase in the light emission amount of the light source, the rotation speed of the substrate and the hot plate is increased under conditions that the increase in the rotation speed of the substrate and the hot plate is completed at the time of or before the increase in the light emission amount of the light source and that a position of the substrate at the time of the increase in the light emission amount of the light source and a position of the substrate at the time of the decrease in the light emission amount of the light source coincide with each other.

12. The substrate processing method of claim 9, further comprising:

performing a first rotation control of rotating the substrate and the hot plate together in a first direction, decreasing the rotation speed of the substrate and the hot plate in the first direction in synchronization with the decrease in the light emission amount of the light source, and increasing the rotation speed of the substrate and the hot plate in the first direction in synchronization with the increase in the light emission amount of the light source; and performing a second rotation control of rotating the substrate and the hot plate together in a second direction opposite to the first direction, decreasing the rotation speed of the substrate and the hot plate in the second direction in synchronization with the decrease in the light emission amount of the light source, and increasing the rotation speed of the substrate and the hot plate in the second direction in synchronization with the increase in the light emission amount of the light source, wherein the first rotation control and the second rotation control are performed under a condition where a position of the substrate at the time when the decrease in the rotation speed is completed in the first rotation control and a position of the substrate at the time when the decrease in the rotation speed is completed in the second rotation control are different from each other.

13. The substrate processing method of claim 12, wherein the first rotation control and the second rotation control are performed such that a rotation range of the substrate during the increase and decrease in the rotation speed in the first rotation control and a rotation range of the substrate during the increase and decrease in the rotation speed in the second rotation control do not overlap each other.

14. The substrate processing method of claim 12, wherein the first rotation control is performed to repeat the increase and the decrease in the rotation speed of the substrate and the hot plate in the first direction in a constant cycle, and the second rotation control is performed to repeat the increase and the decrease in the rotation speed of the substrate and the hot plate in the second direction in the constant cycle.

15. A non-transitory computer-readable storage medium that stores a program that, when executed, cause a computer to execute a substrate processing method comprising:

accommodating a substrate in a processing chamber;

radiating the substrate in the processing chamber with light from a light source;

rotating at least one of the substrate and the light source around an axis intersecting with the substrate in the processing chamber;

switching between an open state where an air flow is allowed to pass from an outside of the processing chamber to an inside of the processing chamber and from the inside of the processing chamber to the outside of the processing chamber and a closed state where the air flow is interrupted using an actuator;

increasing a light emission amount of the light source in synchronization with the switch of the open state to the closed state; and decreasing the light emission amount of the light source in synchronization with the switch of the closed state to the open state.

* * * * *